(12) United States Patent
Oh

(10) Patent No.: US 10,217,758 B2
(45) Date of Patent: Feb. 26, 2019

(54) ELECTRONIC DEVICE AND METHOD FOR FABRICATING THE SAME

(71) Applicant: SK hynix Inc., Gyeonggi-do (KR)

(72) Inventor: Kwang-Seok Oh, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 271 days.

(21) Appl. No.: 15/179,220

(22) Filed: Jun. 10, 2016

(65) Prior Publication Data

US 2017/0154892 A1 Jun. 1, 2017

(30) Foreign Application Priority Data

Nov. 30, 2015 (KR) ........................ 10-2015-0168595

(51) Int. Cl.
*G06F 13/28* (2006.01)
*H01L 27/11556* (2017.01)
(Continued)

(52) U.S. Cl.
CPC .... *H01L 27/11556* (2013.01); *G06F 12/0893* (2013.01); *G06F 13/28* (2013.01); *H01L 23/5283* (2013.01); *H01L 27/1052* (2013.01); *H01L 27/11582* (2013.01); *G06F 2212/603* (2013.01)

(58) Field of Classification Search
None
See application file for complete search history.

(56) References Cited

U.S. PATENT DOCUMENTS 8,637,919 B2 * 1/2014 Lee .................. H01L 27/11578
257/324
8,946,023 B2 2/2015 Makala et al.
(Continued)

FOREIGN PATENT DOCUMENTS

KR 1020110138951 12/2011

*Primary Examiner* — Michael Sun
(74) *Attorney, Agent, or Firm* — IP & T Group LLP

(57) ABSTRACT

Provided is an electronic device including a semiconductor memory, The semiconductor memory may include: a first channel layer formed over a substrate and extending in a vertical direction; a first stacked structure comprising a plurality of first interlayer dielectric layers and a plurality of first gate electrode layers which are alternately stacked along the first channel layer; a first memory layer interpose d between the first channel layer and the first gate electrode layers; a second channel layer formed over the first channel layer and extending in the vertical, direction; a second stacked structure comprising, a plurality of second interlayer dielectric layers and a plurality of second gate electrode layers which are alternately stacked along the second channel layer; a second memory layer interposed between the second channel layer and the second gate electrode layers; a first channel connection pattern formed between the first channel layer and the second channel layer and coupling the first and the second channel layers to each other; and a first etch stop pattern formed between the first and second stacked structures and at substantially the same level as the first channel connection pattern, wherein the first etch stop pattern includes the same material as the first channel connection pattern and is isolated from the first channel connection pattern.

27 Claims, 16 Drawing Sheets

(51) Int. Cl.
   *H01L 27/11582*   (2017.01)
   *H01L 27/105*    (2006.01)
   *H01L 23/528*    (2006.01)
   *G06F 12/0893*   (2016.01)

(56) References Cited

U.S. PATENT DOCUMENTS

| | | | |
|---|---|---|---|
| 9,502,432 B1 * | 11/2016 | Shin | H01L 27/11582 |
| 9,985,048 B2 * | 5/2018 | Lee | H01L 27/0688 |
| 2011/0266611 A1 * | 11/2011 | Kim | H01L 21/28273 |
| | | | 257/324 |
| 2012/0146127 A1 * | 6/2012 | Lee | H01L 21/28282 |
| | | | 257/324 |
| 2012/0223382 A1 * | 9/2012 | Joo | H01L 27/1157 |
| | | | 257/329 |
| 2013/0309849 A1 * | 11/2013 | Jung | H01L 29/66833 |
| | | | 438/479 |
| 2015/0069524 A1 * | 3/2015 | Hong | H01L 27/1203 |
| | | | 257/392 |
| 2016/0343726 A1 * | 11/2016 | Yune | H01L 27/11582 |
| 2017/0069731 A1 * | 3/2017 | Kim | H01L 27/11556 |

\* cited by examiner

ELECTRONIC DEVICE AND METHOD FOR FABRICATING THE SAME

CROSS-REFERENCE TO RELATED APPLICATIONS

The present application claims priority to Korean Patent Application No. 10-2015-0168595, filed on Nov. 30, 2015 which is herein incorporated by reference in its entirety.

BACKGROUND

1. Field

This patent document relates to a semiconductor device and more particularly, to an electronic device including a plurality of memory cells which are vertically stacked over a substrate, and a method for fabricating the same.

2. Description of the Related Art

A NAND-type has h memory and the like have been developed as a semiconductor device which can store data and maintain the stored data even though a power supply is cut off.

Recently a method for improving an integration density of a 2D memory device in which memory cells are formed as a single layer over a silicon substrate has reached its limit. Thus, variety of 3D nonvolatile memory devices have been proposed including a plurality of memory cells which are vertically stacked over a silicon substrate.

SUMMARY

Various embodiments are directed to an electronic device which is capable of reducing the difficulty level of the process and securing memory cell characteristics and operation characteristics, and a method for fabricating the same.

In an embodiment, there is provided an electronic device including a semiconductor memory. The semiconductor memory may include: a first channel layer formed over a substrate and extending in a vertical direction; a first stacked d structure comprising a plurality of first interlayer dielectric layers and a plurality of first gate electrode layers which are alternately stacked along the first channel layer; a first memory layer interposed between the first channel layer and the first gate electrode layers; a second channel layer formed over the first channel layer and extending in the vertical direction; a second stacked structure comprising a plurality of second interlayer dielectric layers and a plurality of second gate electrode layers which h are alternately stacked along the second channel layer; a second memory layer interposed between the second channel layer and the second gate electrode layers; a first channel connection pattern formed between the first channel layer and the second channel layer and coupling the first and the second channel layers to each other; and a first etch stop pattern formed between the first and second stacked structures and at substantially the same level as the first channel connection pattern, wherein the first etch stop pattern includes the same material as the first channel connection pattern and is isolated from the first channel connection pattern.

Implementations of the above semiconductor device may include one or more the following.

The semiconductor memory further comprises: an insulating material provided between the first channel connection pattern and the first etch stop pattern. The first channel connection pattern has a width greater than a top surface of the first channel layer and a bottom surface of the second channel layer. The semiconductor memory further comprises: a first slit passing through the first stacked structure, the first etch stop pattern, and the second stacked structure. The first etch stop pattern has a width greater than the first slit. The semiconductor memory further comprises: a third channel layer passing through the first stacked structure, wherein the first and the third channel layers are arranged in parallel to each other and at substantially the sa me level t a fourth channel layer passing through the second stacked structure, wherein the second and the fourth channel layers are arranged in parallel to each other and at substantially the same level; and a second channel connection pattern formed between the third channel layer and the fourth channel layer and coupling the third and fourth channel layers to each other, and wherein each of the first and the second channel connection patterns has an island shape. The semiconductor memory further comprises: a second etch stop pattern formed between the first and second stacked structures and at substantially the same level as the first etch stop pattern, and a second sift passing through the first stacked structure, the second etch stop pattern, and the second stacked structure. The semiconductor memory further comprises: a second slit passing through the first stacked structure, the first etch stop pattern, and the second stacked structure. Each of the first channel connection pattern and the first, etch stop pattern comprise a conductive material. The semiconductor memory further comprises: a first epitaxial layer, wherein the first channel layer has a tube shape with a hollow center, wherein the first memory layer surrounds an outer sidewall and a bottom surface of the first channel layer, and wherein the first epitaxial layer extends from the substrate to the hollow center of the first channel layer to connect the substrate and the first channel layer to each other. The semiconductor memory further comprises: a second epitaxial layer, wherein the second channel layer has a tube shape with a hollow center, wherein the second memory layer surrounds an outer sidewall and a bottom surface of the second channel layer, and wherein the second epitaxial layer extends from the substrate to the hollow center of the second channel layer to connect the substrate and the second channel layer to each other. The first channel layer is in direct contact with the substrate. The second channel layer is in direct contact with the first channel connection pattern. The first memory layer further extends between the first interlayer dielectric layer and the first gate electrode layer. The second memory layer further extends between the second interlayer dielectric layer and the second gate electrode layer. The semiconductor memory further comprises: a third channel layer and a connection member, wherein the third channel layer passes through the first stacked structure and is arranged in parallel to the first channel layer at substantially the same level, and wherein the connection member is formed in the substrate and coupled to bottoms of the first and the third channel layers. The semiconductor memory further comprises: an additional gate electrode layer and an insulating layer, wherein the additional gate electrode layer is formed in the substrate, wherein the connection member is formed of the same material as the first channel layer and formed in the additional gate electrode layer and wherein the insulating layer is positioned between the additional gate electrode and the substrate. The connection member includes conductive material.

The electronic device may further include a microprocessor which includes: a control unit configured to receive a signal including command from an outside the microprocessor, and performs extracting decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory is part of the memory unit in the microprocessor.

The electronic device may further include a processor which includes: core unit configured to perform, based on a command inputted from an outside of the processor, an operation corresponding to the command, by using data a cache memory unit configured to store data for performing the operation, data corresponding to a result of performing the operation or an address of data for which the operation is performed; and a bus interface connected between the core unit and the cache memory unit, and configured to transmit data between the core unit and the cache memory wherein the semiconductor memory is part of the cache memory unit in the processor.

The electronic device may further include a processing system which includes a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at east one, of the processor, the auxiliary memory device and the main memory device and the outside, wherein the semiconductor memory is part of the auxiliary memory device or the main memory device in the processing system.

The electronic device may further include a data storage system which includes: a storage device configured to store data and conserve, stored data regardless of power supply; a controller configured to control input and output of data to and from the storage device according to a command inputted form an outside; a temporary storage device configured to temporarily store data exchanged between the storage device and the outside; and an interface configured to perform, communication between at least one of the storage device, the controller and the temporary storage device and the outside, wherein the semiconductor memory is part of the storage device or the temporary storage device in the data storage system.

The electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory is part of the memory or the buffer memory in the memory system.

In an embodiment, a method for fabricating an electronic device including a semiconductor memory may include: forming a first stacked structure over a substrate the first stacked structure including a plurality of first interlayer dielectric layers and first material layers which are alternately stacked over each other; forming a first channel hole by selectively etching the first stacked structure; forming a first channel layer in the first channel ho e; forming a channel connection, pattern and an etch stop pattern over the first stacked structure, wherein the channel connection pattern overlaps the first channel hole and wherein the etch stop pattern is formed of the same material as the channel connection pattern, is isolated from the channel connection pattern, and is formed at substantially the same level as the channel connection pattern; forming a second stacked structure over the channel connection pattern and the etch stop pattern, the second stacked structure including a plurality of second interlayer dielectric layers and second material layers which are alternately stacked over each other; forming a second channel hole to expose the channel connection pattern by selectively etching the second stacked structure; forming a second channel layer in the second channel hole; forming an initial slit by etching the second stacked structure to expose the etch stop pattern; and forming a final slit by etching the exposed etch stop pattern and the first stacked structure located under the exposed etch stop pattern.

Implementations of the above method may include one or more the following.

The method further comprising: providing an insulating material between the channel connection pattern and the etch stop pattern. The channel connection pattern has a larger width than a top surface of the first channel hole and a bottom surface of the second channel hole. The etch stop pattern has a width greater than the slit. The forming of the first channel layer comprises: forming a memory and a channel material in the first channel hole; and etching the memory material and the channel material through a blanket etch process until a bottom surface of the first channel hole is exposed. The forming of the second channel layer comprises: forming a memory material and a channel material in the second channel hole; and etching the memory material and the channel material through a blanket etch process until a bottom surface of the second channel hole is exposed. The method further comprising: forming an epitaxial layer over the bottom surface of the first channel hole after the etching of the memory material and the channel material. The method further comprising: forming, an epitaxial layer over the bottom surface of the second channel hole after the etching of the memory material and the channel material. The method further comprising: forming a first memory layer over a sidewall of the first channel hole, wherein the first channel layer is formed over the first memory layer. The method further comprising: forming a second memory layer over a sidewall of the second channel hole, wherein the second channel layer is formed over the second memory layer. The method further comprising: after the forming of the final slit, removing the first and the second material layers exposed through the final slit to form first spaces and second spaces, respectively and filling first and second conductive materials in the first and the second spaces, respectively. The method further comprising: forming a first memory layer along inner walls of the first spaces; and forming a second memory layer along inner walls of the second spaces, wherein the first conductive material is formed over the first memory layer, and wherein the second conductive material is formed over the second memory layer. The method further comprising: forming a gate electrode layer in the substrate, forming a sacrificial layer in the gate electrode layer so that the gate electrode layer surrounds a sidewall and a bottom surface of the sacrificial layer; forming a third channel hole by selectively etching the first stacked structure, wherein the third channel layer is arranged in parallel to the first channel hole and at substantially the same level, wherein the first and the third channel holes expose the sacrificial layer; removing the sacrificial layer through the first and the third channel holes to form a trench in the gate electrode layer; and forming a memory layer over inner surfaces of the first channel hole, the third channel hole, and the trench. The method further comprising: forming a conductive layer in the substrate; and forming a third channel hole by selectively etching the first stacked structure, wherein the third channel layer is arranged in parallel to the first channel hole and at substantially the same level, and wherein the first and the third channel holes expose the conductive layer.

These and other aspects, implementations and associated advantages are described in greater detail in the drawings, the description and the claims.

DETAILED DESCRIPTION

Figure 1A:
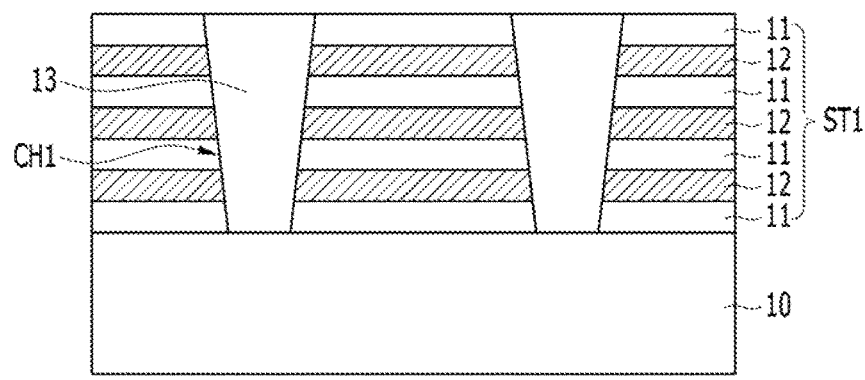
FIGS. 1A to 1D are cross-sectional views for describing a method for fabricating a semiconductor device in accordance with a comparative example and problems thereof.

Various embodiments will be described below in more detail with reference to the accompanying drawings. The present invention may, however, be embodied in different forms and should not be construed as limited to the embodiments set forth herein. Rather, these embodiments are provided so, that this disclosure will be thorough and complete and will fully convey the scope of the present invention to those skilled in the art. Throughout the disclosure, like reference numerals refer to like parts throughout the various figures and embodiments of the p resent invention.

Before embodiments of the present invention are described, problems which may occur during a fabrication process for a semiconductor device in accordance with a comparative example will be described as follows.

FIGS. 1A to 1D are cross-sectional views for describing a method for fabricating a semiconductor device in accordance with a comparative example and associated problems thereof.

Referring to FIG. 1A, a first stacked structure ST1 may be formed over a substrate 10 having a predetermined lower structure illustrated), the first stacked structure ST1 including a plurality of first interlayer dielectric layers 11 and first sacrificial layer 12 which are alternately stacked.

Then, the first stacked structure ST1 may be selectively etched to form a channel hole CH1 which exposes a part of the substrate 10, and a pillar-shaped sacrificial pattern 13 may be buried in the first channel hole CH1.

Figure 1B:
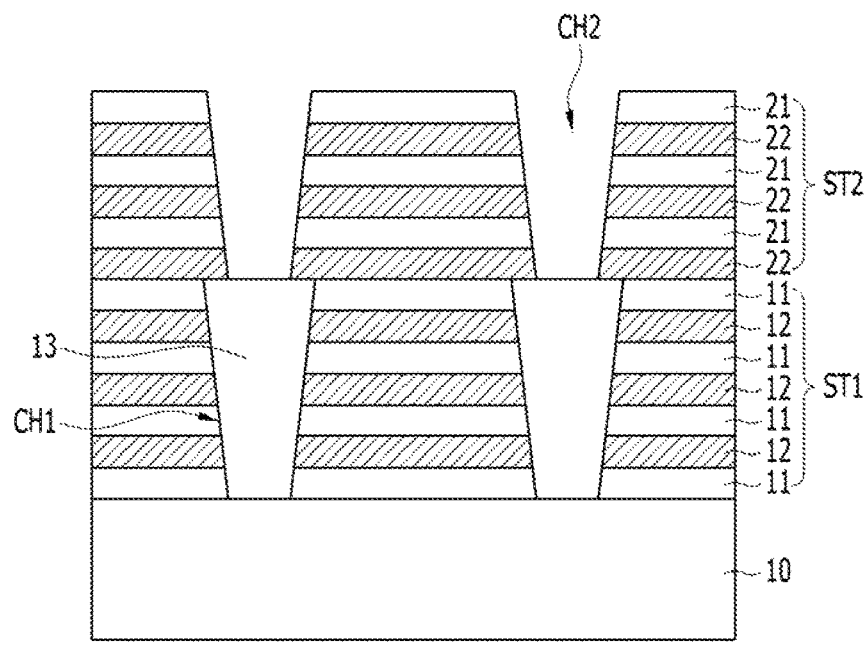

Referring to FIG. 1B, a second stacked structure ST2 may be formed over the resultant structure of FIG. 1A, the second stacked structure ST2 including a plurality of second interlayer dielectric layers 21 and second sacrificial layers 22 which are alternately stacked. The second interlayer dielectric layer 21 and the second sacrificial layer 22 may be formed of the same materials as the first interlayer dielectric layer 11 and the first sacrificial layer 12, respectively.

Then, the second stacked structure ST2 may be selectively etched to form a second channel hole CH2 which exposes the top surface of the sacrificial pattern 13.

Figure 1C:
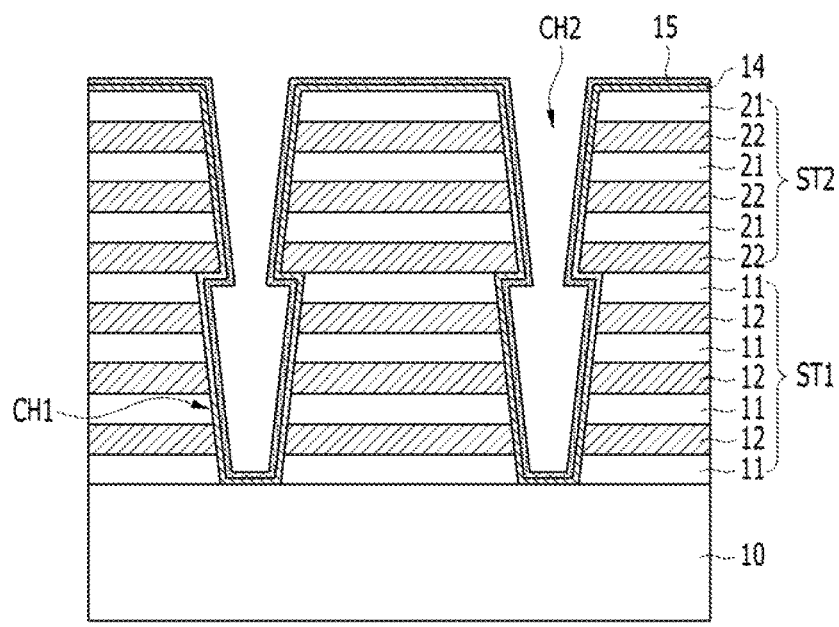

Referring to FIG. 1C, the sacrificial pattern 13 may be removed to form a channel hole CH1 and CH2. The first and second channel holes CH1 and CH2 are connected to each other.

Then, a memory layer 14 and a channel layer 15 may be formed along the entire surface of the resultant structure having the channel hole CH1 and CH2.

Figure 1D:
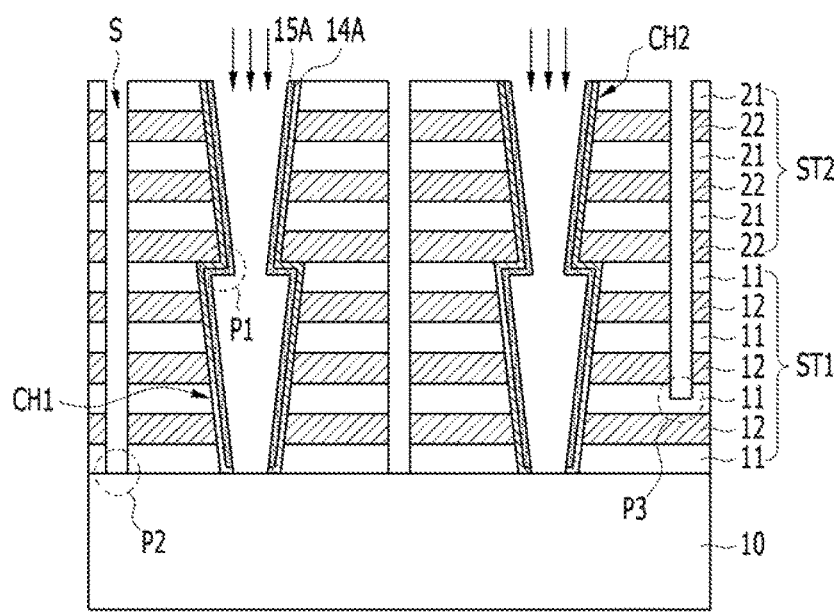

Referring to FIG. 1D, a blanket etch process (refer to downward arrows) may be performed on the memory layer 14 and the channel layer 15 to expose the substrate 10 at the bottom surface of the channel hole CH1 and CH2. When the bottom surface of the channel hole CH1 and CH2 is covered by the memory layer 14, it is impossible to connect the substrate 10 and the channel layer 15. Thus, the substrate to 10 at the bottom surface of the channel hole CH1 and CH2 needs to be exposed. During the present process the memory layer 14 and the channel layer 15 on the top surface of the second stacked structure ST2 may also be removed. As a result, a memory layer pattern 14A and a channel layer pattern 15A may be formed on the sidewalls of the channel hole CH1 and CH2.

The first and second stacked structures ST1 end ST2 may be selectively etched to form a slit S which is positioned between t neighboring channel holes CH1 and CH2 while passing through the first and second stacked structures ST1 and ST2. The slit S may serve as a supply path of gas or chemical for removing the first and second sacrificial layers 12 and 22.

Then, although not illustrated, the first and second sacrificial layers 12 and 22 exposed through the slit S may be removed to form spaces, and gate electrodes may be formed by burying a conductive material in the spaces from which the first and second sacrificial layers 12 and 22 are removed.

As a result, a semiconductor device may be completed, which, includes a plurality of memory cells stacked along the channel layer pattern 15A extended in a direction perpendicular to an upper surface of the substrate 10. Each of the memory cells may include one gate electrode connected to the channel layer pattern 15A. The memory layer pattern 14A is positioned between two neighboring gate electrodes. A plurality of memory cells formed along one channel layer pattern 15A may be connected in series to form one memory cell string.

However, when the above-described semiconductor device is fabricated, the following problems may occur. The width of each of the first channel hole CH1 and the second channel hole CH2 decreases from top to bottom due to the characteristic of the dry etching process. For this reason, while the memory layer 14 and the channel layer 15 are etched through the blanket etch process in order to open the bottom surface of the channel hole CH1 and CH2, the channel layer pattern 15A positioned on the bottom sidewalls P1 of the second channel hole CH2 may be lost because the channel layer pattern 15A is vulnerable to the etch process. When a part of the channel layer pattern 15A is lost, a part of memory cells may lose their functions, and the serial connection of the memory cells may be cut off. Then, the memory cells may not operate as a memory cell string.

Furthermore, while the first channel hole CH1 and the second channel hole CH2 are formed through separate mask and etch processes, the slit S may be formed through one mask and etch process. The slit S has a smaller width than the first channel hole CH1 and, the second channel hole CH2. Thus, when the slit within the first stacked structure ST1 and the slit within the second stacked structure ST2 are formed through separate processes like the first channel hole CH1 and the second channel hole CH2 it is difficult to align the slit within the first stacked structure ST1 and the slit: within the second stacked structure ST2 to each other. Thus, an overlap margin is low and a manufacturing process is likely to fall. In addition, depending on regions, the slits S may be formed to different depths. For example, one slit S may penetrate both of the first and second stacked structures ST1 and ST2 (refer to P2), and another slit S may be formed only the second stacked structure ST2 and does not, penetrate a part first stacked structure ST1. (refer to P3). That is, it is difficult to maintain the depths of the slits S uniformly.

The present embodiment ad dresses the above-described problems, reduces the level of difficulty of the process, and secures memory cell characteristics and operation characteristics. FIGS. 2A to 2F are cross-sectional views illustrating a semiconductor device and a method for fabricating the same in accordance with an embodiment. First, the fabrication method will be described.

Figure 2A:
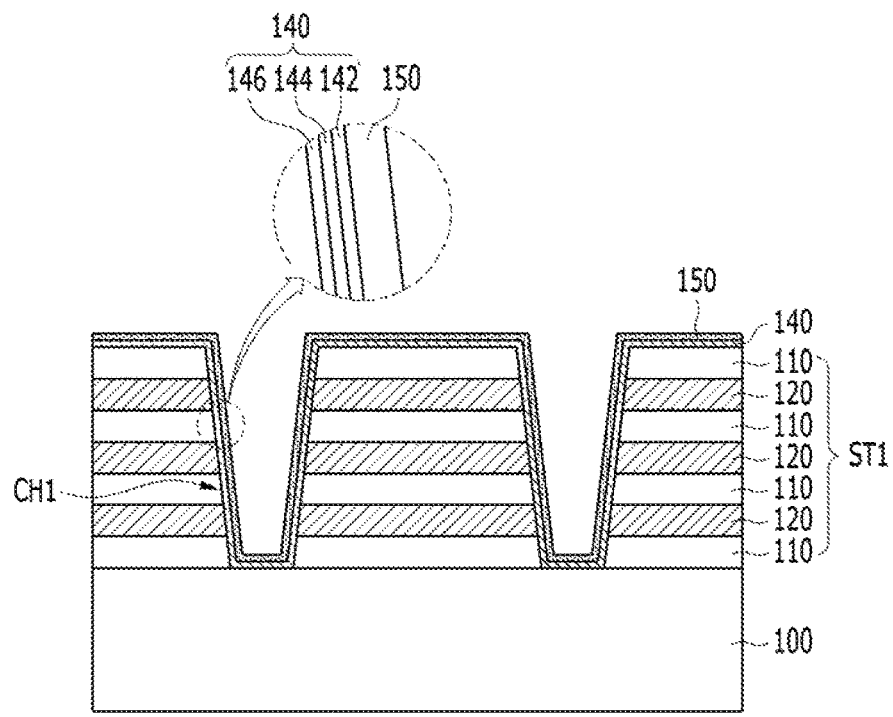
FIGS. 2A to 2F are cross-sectional views illustrating semiconductor device and a method for fabricating the same in accordance with an embodiment.

Referring to FIG. 2A, a substrate 100 may be prepared. The substrate 100 may include a semiconductor material. Although not, illustrated, the substrate 100 may include a lower structure (not illustrated) for example, an impurity region to be connected to a channel layer.

Then, a first stacked structure ST1 may be formed over the substrate 100, the first stacked structure ST1 including a plurality of first interlayer dielectric layers 110 and first material layers 120 which are alternately stacked. The first material layer 120 may include a sacrificial layer which will be replaced with a gate electrode of a memory cell during a subsequent process or a conductive layer which functions as a gate electrode of a memory cell.

When the first material layer 120 is a sacrificial layer, the first material layer 120 may be formed of a material having a different etch rate from the first interlayer dielectric layer 110. This prevents a loss of the first interlayer dielectric layer 110 during a subsequent process for removing the first material layer 120. For example when the first interlayer dielectric layer 110 is formed of silicon oxide, the first material layer 120 may be formed of silicon nitride or amorphous carbon. When the first material layer 120 is a conductive layer, the first material layer 120 may be formed of various conductive materials such as metal, metal nitride polysilicon doped with an impurity, and a combination thereof.

The first, interlayer dielectric layer 110 may serve to insulate the gate electrodes of memory cells adjacent to each other in the vertical direct on, and include various insulating materials such as silicon oxide, silicon nitride, silicon oxynitride, and a combination thereof.

The first stacked structure ST1 may be selectively etched to form a first channel hole CH1 which exposes a part of the substrate 100. Then, a first memory layer 140 and a first channel layer 150 may be formed along the entire surface of the resultant structure having the first channel hole CH1.

Referring to a dotted circle in FIG. 2A, which illustrates a part of the first memory layer 140, the first memory layer 140 may include a first tunnel insulating layer 142, a first charge storage layer 144, and a first charge blocking layer 146 which are sequentially arranged over the first channel layer 150. The first tunnel insulating layer 142 may allow tunneling of a charge and include silicon oxide. The first charge storage layer 144 may store charges and include silicon nitride or polysilicon. The first charge blocking layer 146 may serve to block migration of charges and may include silicon oxide. The first channel layer 150 may be formed of various semiconductor materials such as polysilicon.

Figure 2B:
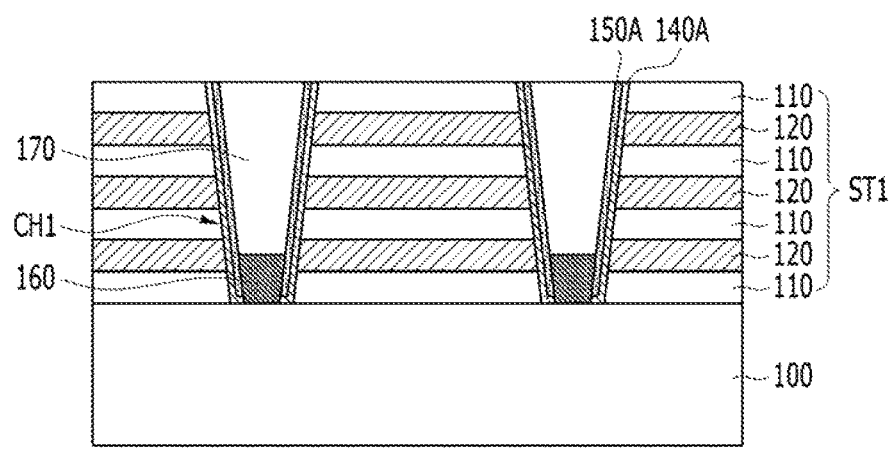

Referring to FIG. 2B, a blanket etch process may be performed on the first memory layer 140 and the first channel layer 150 to expose the substrate at the bottom surface of the first channel hole CH1. During the blanket etch process, the first memory layer 140 and the first channel layer 150 on the top surface of the first stacked structure ST1 may be removed. As a result, a first memory layer pattern 140A and a first channel layer pattern 150A may be formed on the sidewalls of the first channel hole CH1. The lowermost part of the first memory layer pattern 140A may slightly protrude toward the center of the first channel hole CH1 and is in direct contact with the sidewalls of the first channel hole CH1. The first channel layer pattern 150A may be positioned on the protruding lowermost part of the first memory layer pattern 140A and is in direct contact with the sidewalls of the first memory layer pattern 140A. That is, the first channel layer pattern 150A may not be in direct contact with the substrate 100.

Subsequently, an epitaxial growth process may be performed to form a first epitaxial layer 160 over the substrate 100 at the bottom surface of the first channel hole CH1. The first epitaxial layer 160 for connecting the first channel layer pattern 150A to the substrate 100 may be grown to a level equal to or higher than the bottom surface of the first channel layer pattern 150A.

Then, an insulating material nay be deposited on the resultant structure having the first epitaxial layer 160. The insulating material may be deposited to such a thickness so as to sufficiently first channel hole CH1. Then, a planarization process is performed against the insulating material until the top surface of the first stacked structure ST1 is exposed. As a result, a first insulating pattern 170 is formed in the first channel hole CH1 and over the first epitaxial layer 160.

Figure 2C:
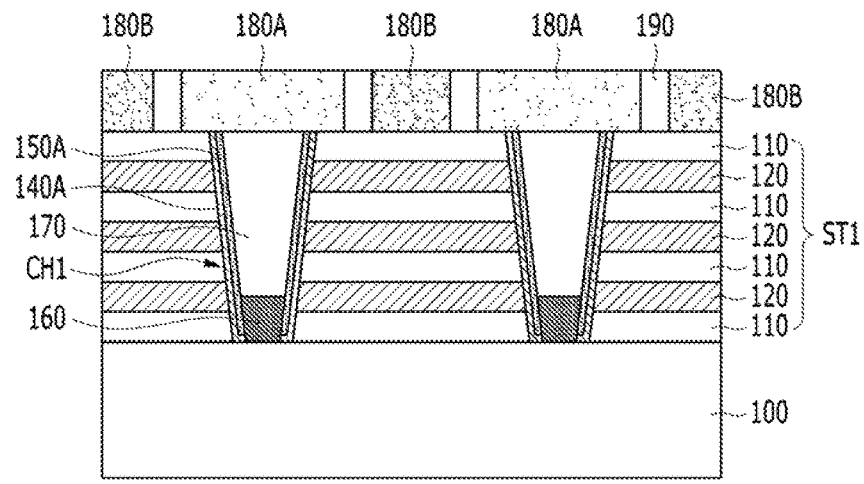

Referring to FIG. 2C a channel connection pattern 180A and an etch stop pattern 180B may be formed over the resultant structure of FIG. 2B. At this time, the channel connection pattern 180A may be formed to overlap the first channel hole CH1 and the etch stop pattern 180B may be formed to overlap the region in which a slit is formed. The channel connection pattern 180A and the etch stop pattern 180B may be isolated from each other by a predetermined distance, and an insulating material 190 may be provided between the channel connection pattern 180A and the etch stop pattern 180B.

As long as the channel connection patterns 180A overlap the plurality of first channel holes CH1 and the etch stop patterns 180B overlap a plurality of slits, respectively, the shapes of the channel connection pattern 180A and the etch stop pattern 180B may be modified in various manners. The plane shapes of the channel connection pattern 180A and the etch stop pattern 180B are illustrated in FIGS. 3A and 3B.

Figure 3A:
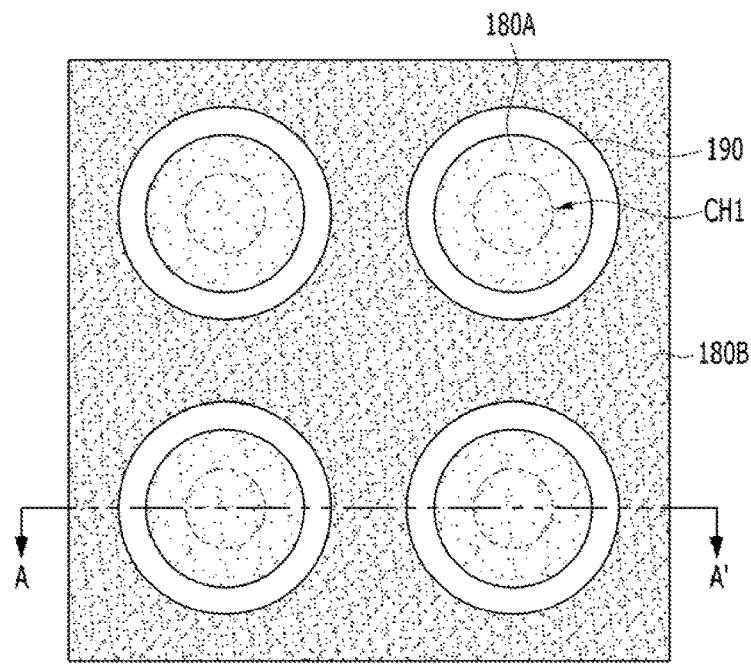
FIG. 3A is a plane view of a channel connection pattern and n etch stop pattern according to an embodiment.

FIG. 3A is a plane view of the channel connection pattern and the etch stop pattern, and FIG. 2C is a cross-sectional view taken along the line A-A' of FIG. 3A.

Referring to FIG. 3A the channel connection pattern 180A may have an island shape which overlaps the first channel holes CH1. In order to secure an overlap margin between the channel connection pattern 180A and the first channel hole CH1, the channel connection pattern 180A may have a larger width than the top surface of the first channel hole CH1. The etch stop pattern 180B may be formed to cover the rest region in which the channel connection pattern 180A is not formed while being isolated by a predetermined distance from the channel connection pattern 180A. Since each of the slits will be positioned between two first channel holes CH1 adjacent to each other in a first direction parallel to line A-A and extended in a second direction perpendicular to line A-A', the etch stop pattern 180B may overlap all of the slits which will be formed later.

Figure 3B:
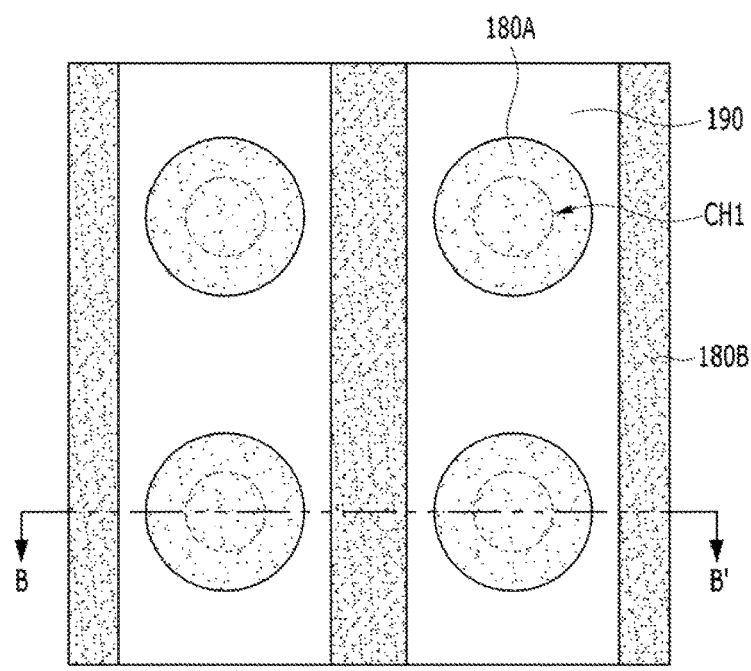
FIG. 3B is a plane view of a channel connection pattern and an etch stop pattern according to an embodiment.

FIG. 3B is a plane view of the channel connection pattern and the etch stop pattern according to another embodiment, and FIG. 2C s a cross-sectional view taken along the line B-B' of FIG. 3B.

Referring to FIG. 3B, the channel connection pattern 180A may have an island shape which overlaps each of the first channel holes CH1. The etch stop pattern 180B may overlap slits which will be positioned between two first channel holes CH1 adjacent to each other in a first direction parallel to line B-B' and extended in a second direction perpendicular to line B-B'. That is, the etch stop pattern 180B may have a line shape extended in the second direction. In order to secure, an overlap margin between a slit and the etch stop pattern 180B, the width of the etch stop pattern 180B measured in the line B-B' may be larger than the width of the slit measured in the line B-B'.

Referring back to FIG. 2C, the channel connection pattern 180A and the etch stop pattern 180B ray be formed through a series of processes of depositing a conductive material such as a metal-containing material or semiconductor material doped with an impurity over the resultant structure of FIG. 2B and then selectively etching the conductive material. That is, the channel connection pattern 180A and the etch stop pattern 180B may be formed of the same material and at the same level in the vertical, direction. The insulating material 190 may be formed through a series of processes of depositing an insulating material to cover the resultant structure in which the channel connection pattern 180A and the etch stop pattern 180B are formed, and then performing a planarization process until the top surfaces of the channel connection pattern 180A and the etch stop pattern 180B are exposed.

Figure 2D:
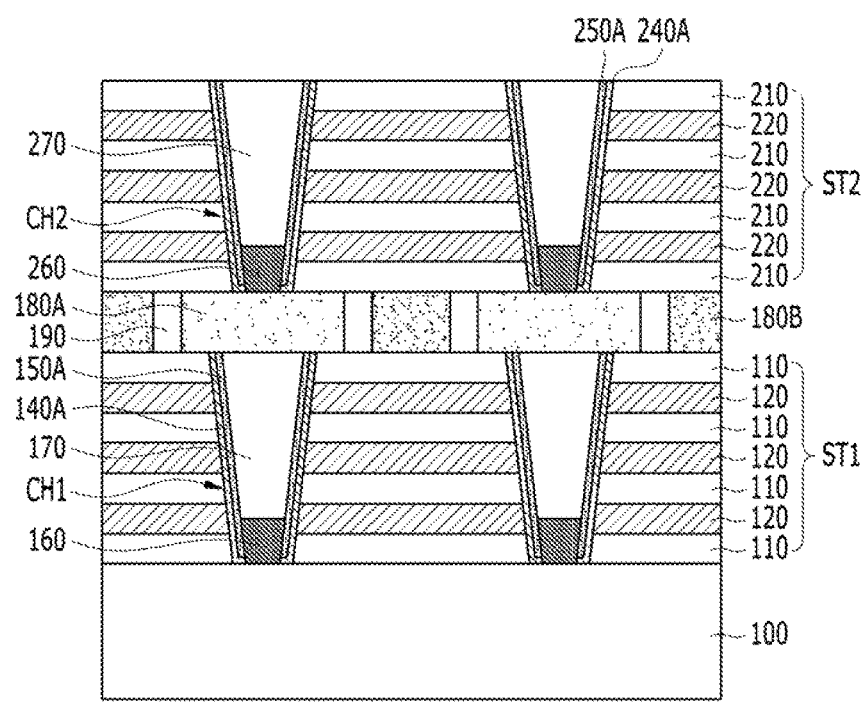

Referring to FIG. 2D, a second stacked structure ST2 may be formed over the resultant structure of FIG. 2C, the second stacked structure ST2 including a plurality of second interlayer dielectric layers 210 and second material layers 220 which are alternately stacked. The second interlayer dielectric layer 210 and the second material layer 220 may be formed of the same materials as the first interlayer dielectric layer 110 and the first material layer 130, respectively.

The second stacked structure ST2 may be, selectively etched to form a plurality of second channel holes CH2 which expose respective channel connection patterns 180A through the second stacked structure ST2. In order to secure an overlap; margin, the bottom surface of the second channel hole CH2 may have a mailer width than the channel connection pattern 180A.

Then, a second memory layer pattern 240A and a second channel layer pattern 250A may be formed on the sidewalls of the second channel hole CH2, and an epitaxial growth process may be performed to form a second epitaxial layer 260 over the channel connection pattern 180A exposed at the bottom surface of the second channel hole CH2. The second epitaxial layer 260 may connect the channel connection pattern 180A and the second channel layer pattern 250A to each other, The rest space of the second channel hole CH2 may be filled with a second insulating pattern 270.

Figure 2E:
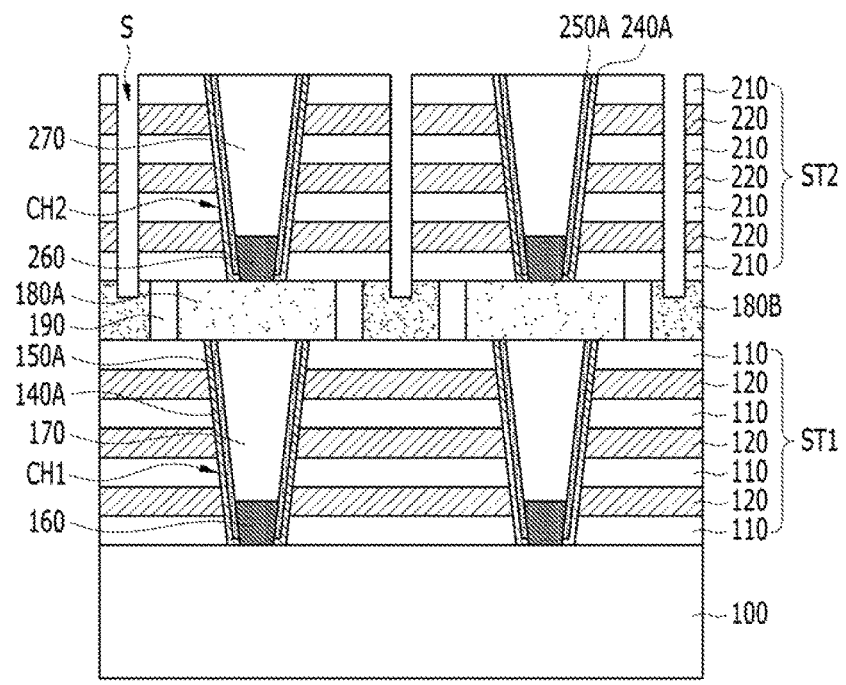
Figure 2F:
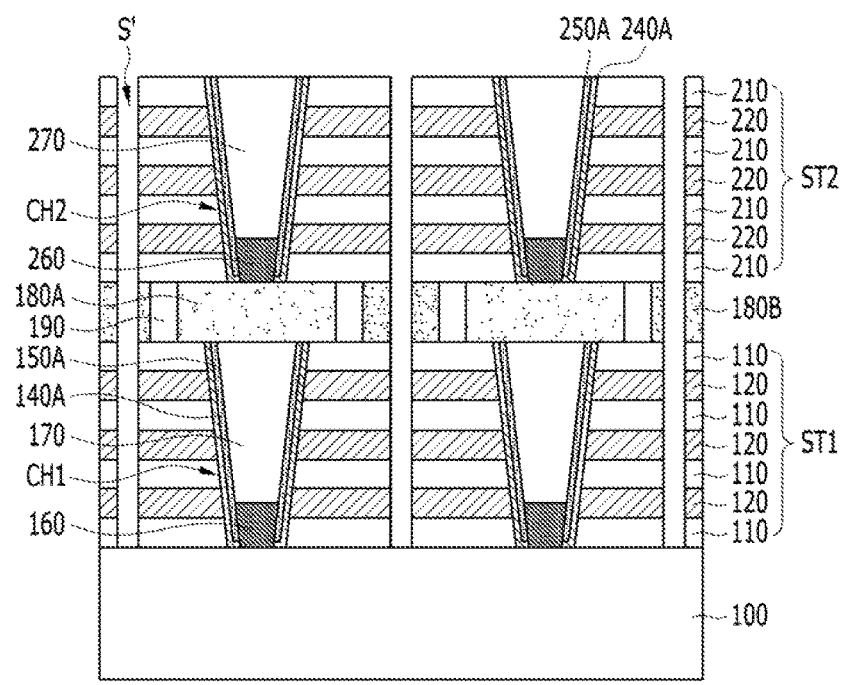

Referring to FIGS. 2E and 2F, a slit S may be formed through the second stacked structure ST2 the etch stop pattern 180B, and the first tacked structure ST1. The slit S' may be positioned between two second channel holes CH2 adjacent to each other in the first direction and between two first channel holes CH1 adjacent to each other in the first direction. The slit S' may extend in the second direction. The formation process for the slit S' may be two steps.

First as illustrated in FIG. 2E, a mask pattern (not illustrated) may be formed over the second stacked structure ST2 so as to expose a region in which the slit S will be formed, and the second stacked structure ST2 may be etched using the mask pattern as an etch barrier. The etch process is stopped at the etch stop pattern 180B to form an initial slit S. That is, the etch process may be performed until the etch stop patterns 180B are exposed.

Then, as illustrated in FIG. 2F, the structure under the initial slit S, that is, the etch stop pattern 180B and the first stacked structure ST1 may be additionally etched to complete the slit S'.

When the first and second material layers 120 and 220 are sacrificial layers, an additional process (not illustrated) may be further performed. The additional process may include removing the first and second material layers 120 and 220 exposed through the slit S' to form spaces and forming a gate electrode layer by burying a conductive material in each of the spaces from which the first and second material layers were removed. When the first and second material layers 120 and 220 are conductive layers, the additional process may not be performed.

Although not illustrated, a conductive material may be deposited over the second stacked structure ST2 and patterned to form a conductive line which extends in the second direction parallel to the slit S'. The conductive line may contact the second channel layer pattern 250A. When the bottom of the first channel layer pattern 150A is connected to a source region formed in the substrate 100, the conductive line may function as a bit line.

Through the above-described process, the semiconductor device illustrated in FIG. 2F may be fabricated. Referring back to FIG. 2F the semiconductor device in accordance with the present embodiment may include the first stacked structure ST1, the second stacked structure ST2, the channel connection pattern 180A, and the etch stop pattern 180B. The first stacked structure ST1 may include the first channel layer pattern 150A, the first epitaxial layer 160, the first memory layer pattern 140A, the first interlayer dielectric layers 110 and the first material layers 120 and the first memory layer pattern 140A. The first channel layer pattern 150A extends in the vertical direction over the substrate 100 and has a pillar shape with a hollow center. The first epitaxial layer 160 is formed in the hollow center and at the bottom of the first channel layer pattern 150A so as to connect the substrate 100 and the first channel layer pattern 150A. The first memory layer pattern 140A surrounds an outer sidewall and a bottom surface of the first channel layer pattern 150A. The first interlayer dielectric layers 110 and the first material layers 120 are alternately stacked along the first channel layer pattern 150A. The first memory layer pattern 140A is provided between the first material layers 120 and the first channel layer pattern 150A.

The second stacked structure ST2 may include the second channel layer pattern 250A, second epitaxial layer 260, the second memory layer pattern 240A, and the second interlayer dielectric layers 210 and the second material layers 220. The second channel layer pattern 250A extends in the vertical direction and over the first stacked structure ST1 and has a pillar shape with a hollow center. The second epitaxial layer 260 is formed in the empty space at the bottom of the second channel layer pattern 250A to connect the second epitaxial layer 260 and the second channel layer pattern 250A. The second memory layer pattern 240A surrounds an outer sidewall and a bottom surface of the second channel layer pattern 250A. The second interlayer dielectric layers 210 and the second material layers 220 are alternately stacked along the second channel layer pattern 250A with the second memory layer pattern 240A provided therebetween.

The channel connection pattern 180A may connect the first and second channel layer patterns 150A and 250A and is located between the first and second stacked structures ST1 and ST2. The etch stop pattern 180B may overlap the region in which a slit of the first and second stacked structures ST1 and ST2 is formed. The slit may be formed through the first stacked structure ST1, the stop etch pattern 180B, and the second stacked structure ST2.

One first channel layer pattern 150A one first material layer 120 (or gate electrode layer) surrounding the first channel layer pattern 150A, and the first memory layer pattern 140A interposed therebetween may form one memory cell. Similarly, one second channel layer pattern 250A, one second material layer 220 (or gate electrode layer) surrounding the second channel layer pattern 250A, and the second memory layer pattern 240A interposed therebetween may form one memory cell.

According to a voltage applied to the first and second material layers 120 and 220 (or gate electrode layer), charges may be introduced into the charge storage layer 144 from the first and second channel layer patterns 150A and 250A or charges of the charge storage layer 144 may be discharged to the first and second channel layer patterns 150A and 250A. Thus, the memory cells may store different data from each other.

The above-described semiconductor device and the method for fabricating the same can acquire the following advantages. First, since the first channel layer pattern 150A and the second channel layer pattern 250A are formed through separate processes and connected to each other through the channel connection pattern 180A, the first and, second channel layer patterns 150A and 250A may not be etch damaged, unlike the comparative example.

Furthermore, when the slit S is formed an overlap margin can be secured through one mask process, and the depths of the slit S may be maintained uniformly in the entire regions through the etch stop pattern 180B. Furthermore, since the channel connection pattern 180A and the etch stop pattern 180B are formed through a single process, the above-described advantages can be secured without increasing the difficulty level of the process.

The semiconductor device and the method for fabricating the same in accordance with the above-described embodiment may be modified in various manners. For example, the first epitaxial layer 160 may be omitted as long as the first channel layer pattern 150A is in direct contact with the substrate 100. Furthermore, the second epitaxial layer 260 may be omitted as long as the second channel layer pattern 250A is in direct contact with the channel connection pattern 180A. This structure will be described below with reference to FIGS. 4A to 4D.

Furthermore, the first memory layer pattern 140A may be modified in various manners as long as the first memory layer pattern 140A is interposed between the first channel layer pattern 150A and the first material layer 120. Similarly, the second memory layer pattern 240A may be modified in various manners as long as the second, memory layer pattern 240A is interposed between the second channel layer pattern 250A and the second material layer 220. This structure will be described below with reference to FIGS. 5A to 5C.

In the above-described embodiment, the I-shaped memory cell string has been taken as an example. The I-shaped memory cell string includes memory cells stacked between a source region within the substrate 100 and a bit line over the second stacked structure ST2. However the present embodiment is not limited thereto. In another embodiment, a U-shaped memory cell string may be formed, and a source line and a bit line may be coupled to both ends of a U-shaped memory cell. This structure will be described below with reference to FIGS. 6A to 7B.

FIGS. 4A to 4D are cross-sectional views illustrating semiconductor device and method for fabricating the same in accordance with another embodiment. The detailed descriptions of the same parts as those of the above-described embodiment are omitted herein.

Figure 4A:
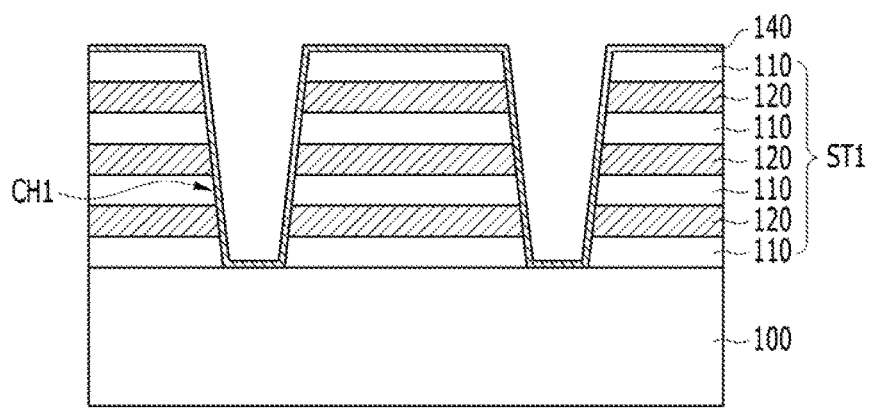
FIGS. 4A to 4D are cross-sectional views illustrating a semiconductor device and method for fabricating the same in accordance with another embodiment.

Referring to FIG. 4A, a first stacked structure ST1 may be formed over a substrate 100, the first stacked structure ST1 including a plurality of first interlayer dielectric layers 110 and first material layers 120 which are alternately stacked, and selectively etched to form a first channel hole CH1. Then, a first memory layer 140 may be formed along the entire surface of the resultant structure having the first channel hole CH1 formed.

Figure 4B:
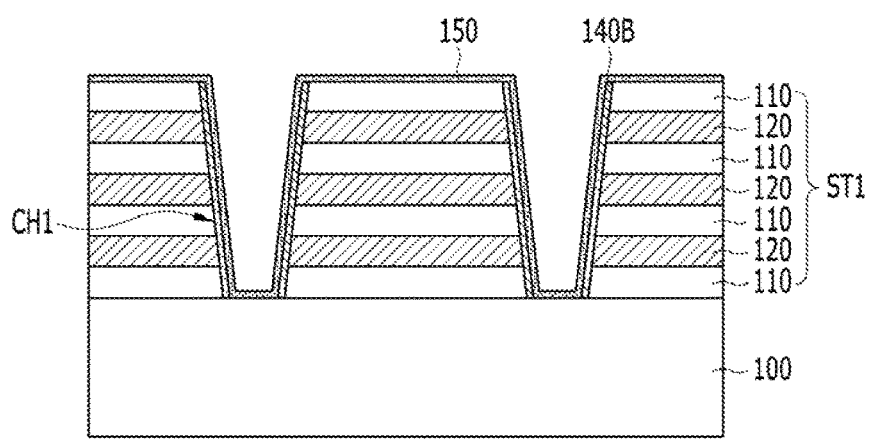

Referring to FIG. 4B a blanket etch process may be performed on the first memory layer 140 to expose the substrate 100 at the bottom surface of the first channel hole CH1. During the blanket etch process, the first memory layer 140 on the top surface of the first stacked structure ST1 may be removed. As, a result, a first memory layer pattern 140B may be formed on the sidewalls of the first channel hole CH1.

Then, a first channel layer 150 may be formed along the entire surface of the resultant structure. The first memory layer pattern 140B is formed between the first channel layer 150 and the first stacked structure ST1. Since the substrate 100 at the bottom surface of the channel hole CH1 is exposed, the first channel layer 150 may be in direct contact with the substrate 100.

In another embodiment (not illustrated), the first channel layer 150 may have a thickness to completely fill the first channel hole CH1 having the first memory layer pattern 140B formed therein. In this case, a pillar-shaped channel layer pattern may be formed through a subsequent process, and the first insulating layer pattern 170B may be omitted. Alternatively, in another embodiment (not illustrated) a blanket etch process may be additionally performed on the first channel layer 150. In this case, the first channel layer 150 may have a hollow pillar shape similar to the first memory layer pattern 140B, while the outer side all of the first channel layer 150 is surrounded by the first memory layer pattern 140B.

Figure 4C:
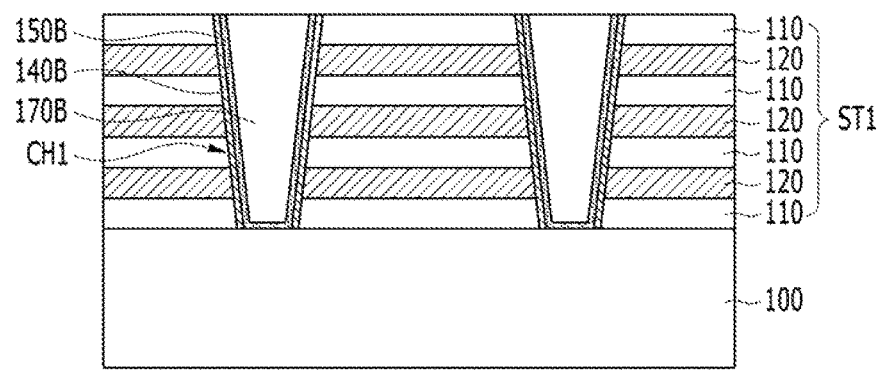

Referring to FIG. 4C, a first insulating pattern 170B may be formed to fill the rest space of the first channel hole CH1. The first insulating pattern 170B may be for red through a series of processes of depositing an insulating material on the resultant structure of FIG. 4B such that the insulating material has a thickness to sufficiently fill the first channel hole CH, and performing a planarization process until the top surface of the first stacked structure ST1 is exposed. During the the first stacked structure ST1 may be removed to form a first channel layer pattern 150B. The first channel layer pattern 150B may be formed along the sidewalls and bottom surface of the first channel hole CH1 having the first memory layer pattern 140B formed therein.

Figure 4D:
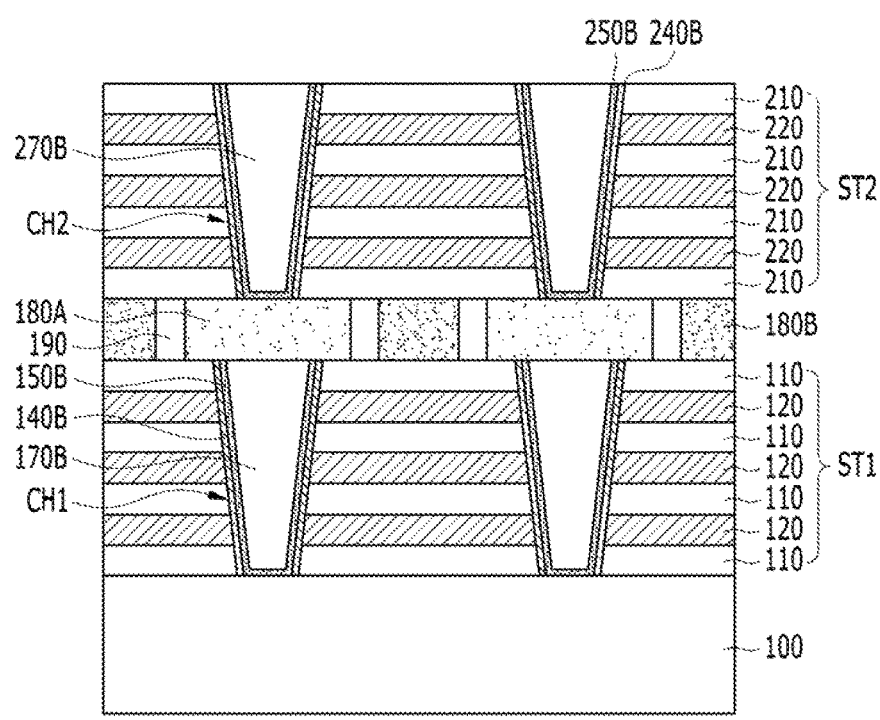

Referring to FIG. 4D, an etch stop pattern 180B and an etch stop pattern 180B may be formed over the resultant structure of FIG. 4C so as to overlap the first channel hole CH1 and the region in which a slit is to be formed, respectively. Between the channel connection pattern 180A and the etch stop pattern 180B, an insulating material 190 may be provided.

Then, a second stacked structure ST2 may be formed. In the second stacked structure ST2, a plurality of second interlayer dielectric layers 210 and second material layers 220 are alternately stacked. The second stacked structure ST2 may be selectively etched to form a plurality of second channel holes CH2 which expose the respective channel connection patterns 180A.

Then, a second memory layer pattern 240B may be formed the sidewalls of the second channel hole CH2, a second channel layer pattern 250B may be formed along the sidewalls and bottom surface of the second channel hole CH2 having the second memory layer pattern 240B. The second channel layer pattern 250B is in direct contact with the channel connection pattern 180A, and a second insulating pattern 270B may be formed to fill the rest space of the second channel hole CH2 on which the second memory layer pattern 240B and the second channel layer pattern 250B are formed.

Although not illustrated, the above-described subsequent processes for example, the slit formation process and the bit line formation process are performed in the same manner as described above with reference to FIGS. 2E and 2F.

The present embodiment may be characterized in that the first and second channel layer patterns 150B and 250B are formed after the first and second memory layer patterns 140B and 240B are subject to a blanket etch process to expose the substrate 100 at the bottom surface of the first channel hole CH1 and/or the channel connection pattern 180A at the bottom surface of the second channel hole CH2, respectively. For this reason, the epitaxial growth process of FIG. 2B or 2D may be omitted.

A part of the processes of FIGS. 2A to 2D and a part of the processes of the present embodiment may be combined. For example, in the present embodiment, the first memory layer pattern 140A, the first channel layer pattern 150A, and the first epitaxial layer 160 of FIG. 2B may be formed in the first channel hole CH1, instead of the first memory layer pattern 140B and the first channel layer pattern 150B. For another example, in the present embodiment the second memory layer pattern 240A, the second channel layer pattern 250A and the second epitaxial layer 260 of FIG. 2D may be formed n the second channel hole CH2 instead of the second memory layer pattern 240B and the second channel layer pattern 250B.

FIGS. 5A to 5D are cross-sectional views illustrating a semiconductor device and a method for fabricating the same in accordance with another embodiment. The detailed descriptions of the same parts as those of the above-described embodiments are omitted herein.

Figure 5A:
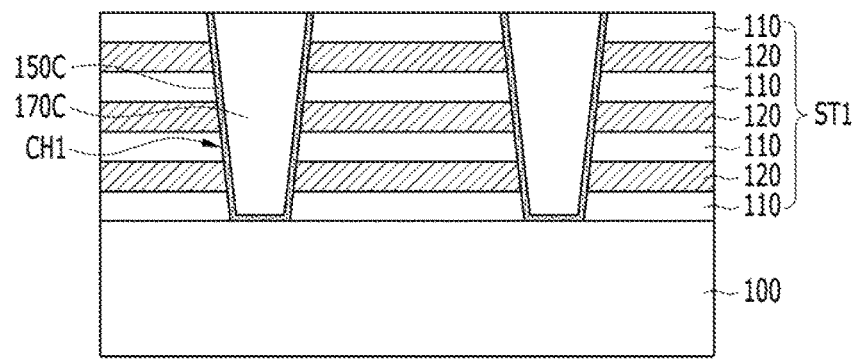
FIGS. 5A to 5D are cross-sectional views illustrating semiconductor device and a method for fabricating the same in accordance with another embodiment.

Referring to FIG. 5A, a first stacked structure ST1 may be formed over a substrate 100 the first stacked structure ST1 including a plurality of first interlayer dielectric layers 110 and first material layers 120 which are alternately stacked, and selectively etched to form a first channel hole CH1.

Then, a first channel layer may be deposited along the entire surface of the resultant structure having the first channel hole CH1 formed therein, an insulating material may be deposited to such a thickness as to completely fill the first channel hole CH1 having the first channel layer formed therein, and a planarization process may be performed until the top surface of the first stacked structure ST1 is exposed. As a result, a first channel layer pattern 150C may be formed along the sidewalls and bottom surface of the first channel hole CH1, and a first insulating pattern 170C may be formed to fill the first channel hole CH1 having the first channel layer pattern 150C formed therein.

In another embodiment (not illustrated), the first channel layer pattern 150C may have a pillar shape that completely fills the first channel hole CH1. In this case, the first insulating pattern 170C may be omitted. Alternatively, in another embodiment (not illustrated), a blanket etch process may be additionally performed on the first channel layer before the insulating material is deposited and after the first channel layer is deposited.

Figure 5B:
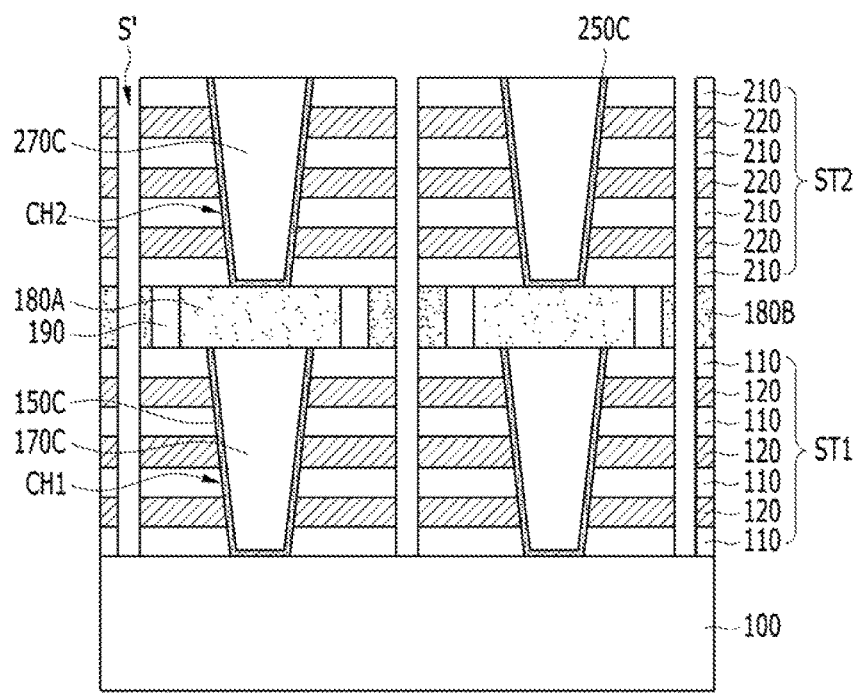

Referring to FIG. 5B, a channel connection pattern 180A and an etch stop pattern 180B may be formed over the resultant structure of FIG. 5A so as to overlap the first channel hole CH1 and the region in, which a slit is to be formed, respectively. Between the channel connection pattern 180A and the etch stop pattern 180B, an insulating material 190 may be provided.

Then, a second stacked structure ST2 may be formed, including a plurality of second interlayer dielectric layers 210 and second material layers 220 which are alternately stacked. The second stacked structure ST2 may be selectively etched to form a plurality of second channel holes CH2 which expose the respective channel connection patterns 180A.

Then, a second channel layer pattern 250C may be formed along the sidewalk and bottom surface of the second channel hole CH2 to be in direct contact with the channel connection pattern 180A. A second insulating pattern 270C may be formed to fill the rest space of the second channel hole CH2 having the second channel layer pattern 250C formed therein.

Then, a slit S may be formed through the second stacked structure ST2, the stop etch pattern 180B, and the first stacked structure ST1.

Figure 5C:
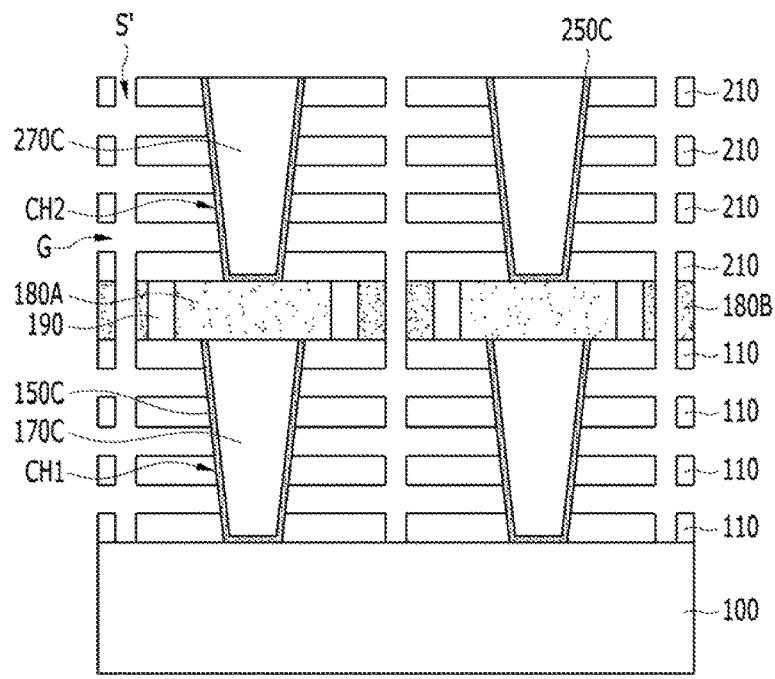

Referring to FIG. 5C, the and second material layers 120 and 220 exposed through the slit S' may be removed through wet etching or the like. The space from which the first and second material layers 120 and 220 were removed may be referred to as a concave groove G.

Figure 5D:
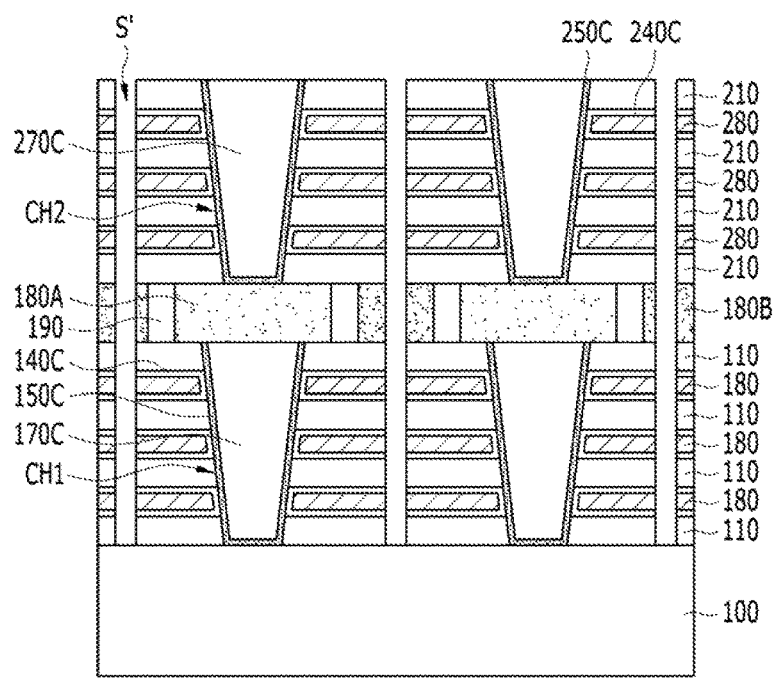

Referring to FIG. 5D, first and second memory layer patterns 140C and 240C may be formed along the inner wall of the concave groove G, and first and second gate electrode layers 180 and 280 may be formed to fill the rest space of the concave groove G having the first and second memory layer patterns 140C and 240C formed therein.

The first and second memory layer patterns 140C and 240C and the first and second gate electrode layers 180 and 280 may be the resultant structure of FIG. 5C, depositing a conductive material to such a thickness to sufficiently fill the rest space of the concave groove G having the memory layer formed therein, and removing the memory layer and the conductive material existing in the slit S' by performing a dry etching process on the memory layer and the conductive material.

The present embodiment may be characterized in that the formation process of the first and second memory layer patterns 140C and 240C is performed at the same time as the formation process of the flat and second gate electrode layers 180 and 280, respectively, after the first and second channel layer patterns 150C and 250C are formed. Thus, the first and second memory layer patterns 140C and 240C may not extend in the vertical direction, and the first and second memory layer patterns 140C and 240C for each of the memory cells arranged the vertical direction are separated from each other.

Figure 6A:
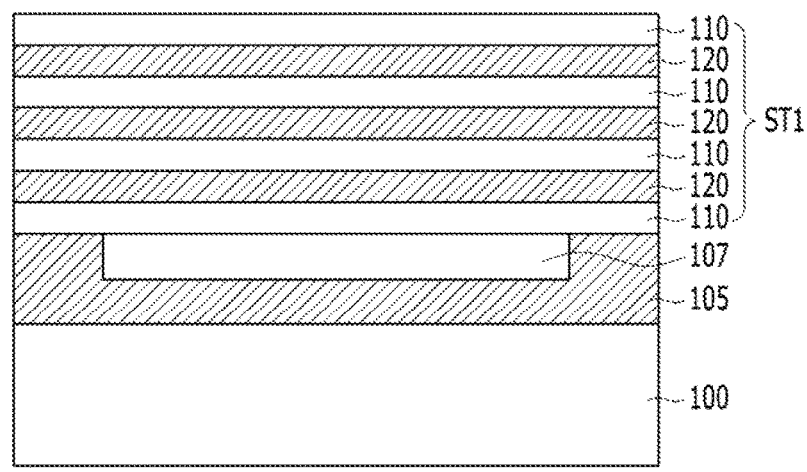
FIGS. 6A and 6B are cross-sectional views illustrating semiconductor device and a method for fabricating the same in accordance with another embodiment.
Figure 6B:
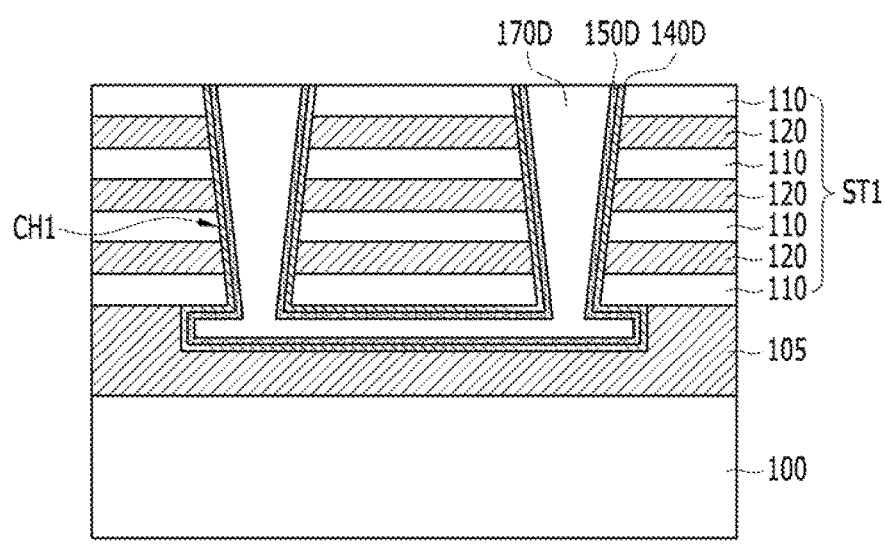

FIGS. 6A and 6B are cross-sectional views illustrating a semiconductor device and a method for fabricating the same in, accordance with another embodiment. The detailed descriptions of the same parts as those of the above-described embodiments are omitted herein.

Referring to FIG. 6A, a gate electrode layer 105 may be formed by depositing a conductive material on a substrate 100, and a sacrificial layer 107 may be buried in a groove formed by etching a part the gate electrode layer 105. The gate electrode layer 105 may be formed of various conductive materials such as a metal, a metal nitride, a semiconductor material doped with an impurity, and a combination thereof.

The sidewalls and bottom surface of the sacrificial layer 107 may be surrounded by the gate electrode layer 105. The sacrificial layer 107 may have a bar shape of which a first-direction axis is longer than a second-direction axis, such that the sacrificial layer 107 can overlap a pair of first channel holes which will be arranged in the first direction.

FIG. 6A illustrates only one sacrificial layer 107. However, a plurality of grooves may be formed in the gate electrode layer 105, and a plurality of sacrificial layers 107 may be buried in the respective grooves. A pair of first channel holes may be formed to overlap each of the sacrificial layers 107.

Then, a first stacked structure ST1 may be formed over the gate electrode layer 105 and the sacrificial layer 107, the first stacked structure ST1 including a plurality of first interlayer dielectric layers 110 and first material layers 120 which are alternately stacked.

Referring to FIG. 6B, the first stacked structure ST1 may be selectively etched to form a pair of first channel holes CH1 each of which exposes the top surface of the sacrificial layer 107. The exposed sacrificial layer 107 may be removed. As a result, the pair of first channel holes CH1 and the space from which the sacrificial layer 107 connecting the bottoms of the first channel holes CH1 was removed may form a U-shaped channel hole.

Then a first memory layer pattern 140D and a first channel layer pattern 150D may be formed along an inner surface of the U shaped channel hole, and the rest space of the U-shaped channel hole may be filled with a first insulating pattern 170D.

The subsequent processes may be performed in substantially the same manner as the above-described embodiments. That is, the formation process of the channel connection pattern 180A and the etch stop pattern 180B, the formation process of the second stacked structure ST2, the second memory layer pattern 240A, the second channel layer pattern 250A, and the second epitaxial layer 260, and the second insulating pattern 270 and the formation process of the slit S' which have been described with reference to FIGS. 2C to 2F may be performed after the process of FIG. 6B. Alternatively, the process of FIG. 4D may be performed after the process of FIG. 6B. Alternatively, the processes of FIGS. 5B to 5D may be performed after the process of FIG. 6B.

In the present embodiment, as the pair of channel layers are connected to each other at the bottoms thereof, the U-shaped channel layer can be formed (refer to 150D). One end of the U-shaped channel layer may be controlled by a bit line, and the other end of the U-shaped channel layer may be controlled by a source line.

The gate electrode layer 105, the first channel layer pattern 150D facing the gate electrode layer 10 and the first memory layer pattern 140D positioned therebetween may form a kind of transistor. According to a voltage applied to the gate, electrode layer 105, the transistor may be turned on or off to control the pair of channel layers.

Figure 7A:
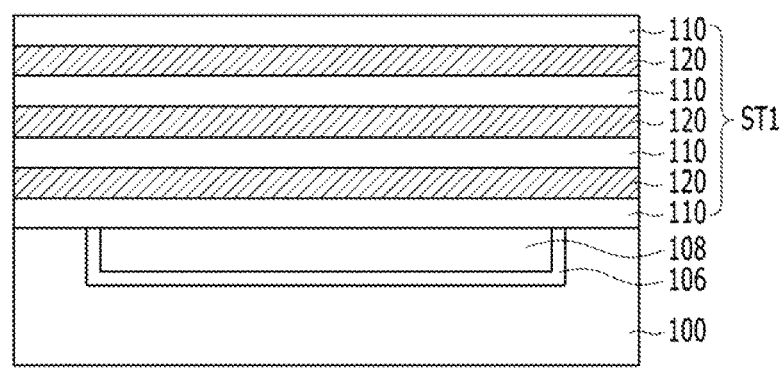
FIGS. 7A and 7B are cross-sectional views illustrating semiconductor device and a method for fabricating the same in accordance with another embodiment.
Figure 7B:
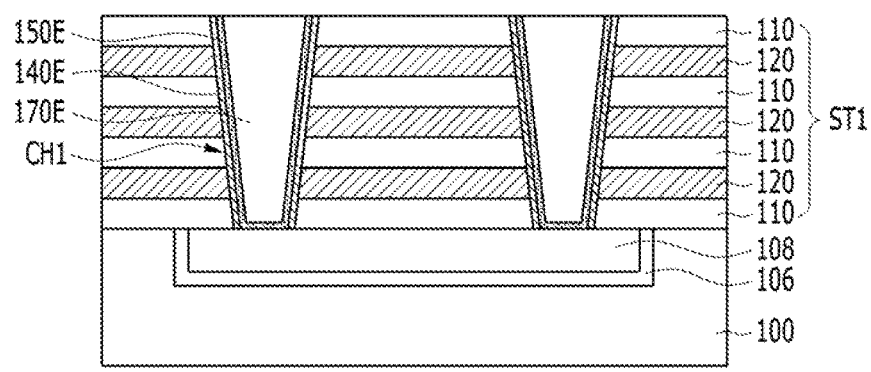

FIGS. 7A and 7B are cross-sectional illustrating a semiconductor device and a method for fabricating the same in accordance with another embodiment. The detailed descriptions of the same parts as those of the above-described embodiments are omitted herein.

Referring to FIG. 7A, an insulating layer 106 may be deposited along the inner wall of a groove formed by etching a part of a substrate 100, and a conductive layer 108 may be buried in the rest space of the groove having the insulating layer 106 deposited therein. The insulating layer 106 may be formed to electrically insulate the conductive layer 108 and the substrate 100 from each other. The insulating layer 106 may be omitted depending on a device design.

The conductive layer 108 may be in direct contact with a pair of first channel layer patterns 150E in order to electrically couple the pair of first channel layer patterns 150E. The conductive layer 108 may be formed of various conductive materials such as a metal, a metal nitride, a semiconductor material doped with an impurity, and a combination thereof. The conductive layer 108 may have a bar shape of which a first-direction axis is longer than a second-direction axis such that the conductive layer 108 can overlap a pair of first channel holes each of which is arranged in the first direction.

FIG. 7A illustrates only one conductive layer 10. However, a plurality of grooves may be formed in the substrate 100, and a plurality of conductive layers 108 may be buried in the respective grooves. The pair of first channel holes may be formed to overlap each of the conductive layers 108. Then, a first stacked structure ST1 may be formed over the substrate 100 having the insulating layer 106 and, the conductive layer 108 the first stacked structure ST1 including a plurality of first interlayer dielectric layers 110 and first material layers 120 which are alternately stacked.

Referring to FIG. 7B the first stacked structure ST1 may be, selectively etched to form a pair of first channel holes CH1 each of which exposes the top surface of the conductive layer 108. Then, a first memory layer pattern 140E, a first channel layer pattern 150E, and a first insulating pattern 170E may be formed in the pair of first channel holes CH1. The first memory layer pattern 140E, the first channel layer pattern 150E, and the first insulating pattern 170E may be formed through the processes of FIGS. 4A to 4C. In another embodiment, however, the first memory layer pattern 140A, the first channel layer pattern 150A, the first epitaxial layer 150, and the first insulating pattern 170 may be formed in the pair of first channel holes CH1 through the processes of FIGS. 2A and 2B. Alternatively, in another embodiment, the first channel layer pattern 150C and the first insulating pattern 170C may be formed in the pair of first channel holes CH1 through the process of FIG. 5A.

As a result of the present process the pair of first channel layer patterns 150E may be connected to each other through the conductive layer 108, and form a U-shaped channel layer.

The subsequent processes may be performed in substantially the same manner as the above-described embodiments. In other words, after the process of FIG. 7B, the processes of FIGS. 2C to 2F, the process of FIG. 4, or the processes of FIGS. 5B to 5D may be, performed.

In accordance with the embodiments, the electronic device and the method for fabricating the same can reduce the difficulty level of the process without compromising the memory cell characteristics and the operation characteristics.

The above and other memory circuits or semiconductor devices based on the disclosed technology can be used in various devices or systems. FIGS. 8-12 provide some examples of devices or systems that can implement the memory circuits disclosed herein.

Figure 8:
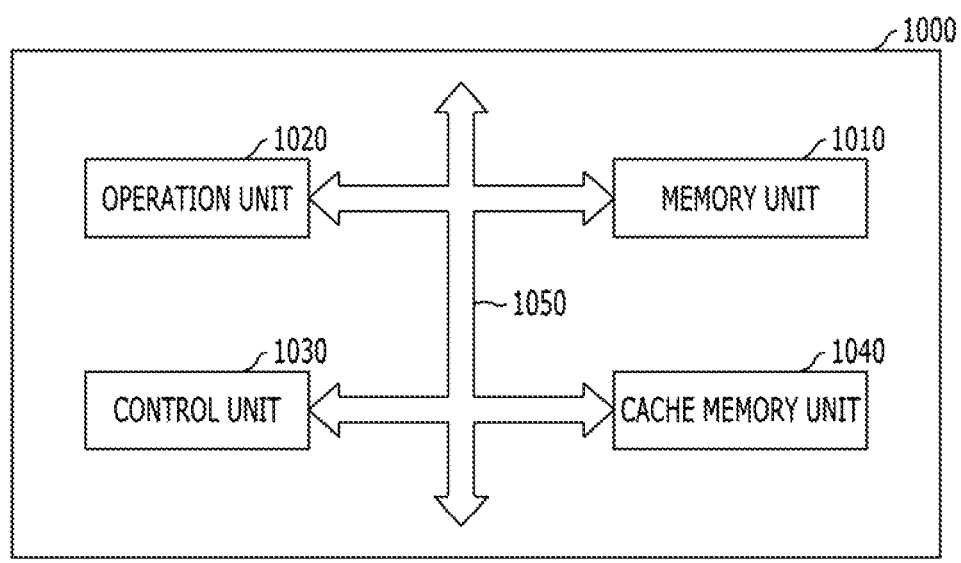
FIG. 8 is an example of configuration diagram of a microprocessor implementing memory circuitry based on the disclosed technology.

FIG. 8 is an example of configuration diagram of a microprocessor implementing memory circuitry based on the disclosed technology.

Referring to FIG. 8, a microprocessor 1000 may perform tasks for control ling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor CAP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020 result data of performing the operations and addresses where data for performing of the operations are stored.

The memory unit 1010 may include one or more the above-described semiconductor devices in accordance with the implementations. For example, the memory unit 1010 may include a first channel layer formed over a substrate and extending in a vertical direction; a first stacked structure comprising a plurality of first interlayer dielectric layers and a plurality of first gate electrode layers which are alternately stacked along the first channel layer; a first memory layer interposed between the first channel layer and the first gate electrode layers; a second channel layer formed over the first channel layer and extending in the vertical direction a second stacked structure comprising a plurality of second interlayer dielectric layers and a plurality of second gate electrode layers which are alternately stacked along the second channel layer; a second memory layer interposed between the second channel layer and the second gate electrode layers; a first channel connection pattern formed between the first channel layer and the second channel layer and coupling the first and the second channel layers to each other; and a first etch stop pattern formed between the first and second stacked structures and at substantially the same level as the first channel connection pattern, wherein the first etch stop pattern includes the same material as the first channel connection pattern and is isolated from the first channel connection pattern. Through this, memory cell characteristics and operating characteristics of the memory unit 1010 may be secured, and processes may be simplified. As a consequence, operating characteristics of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010 the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 9:
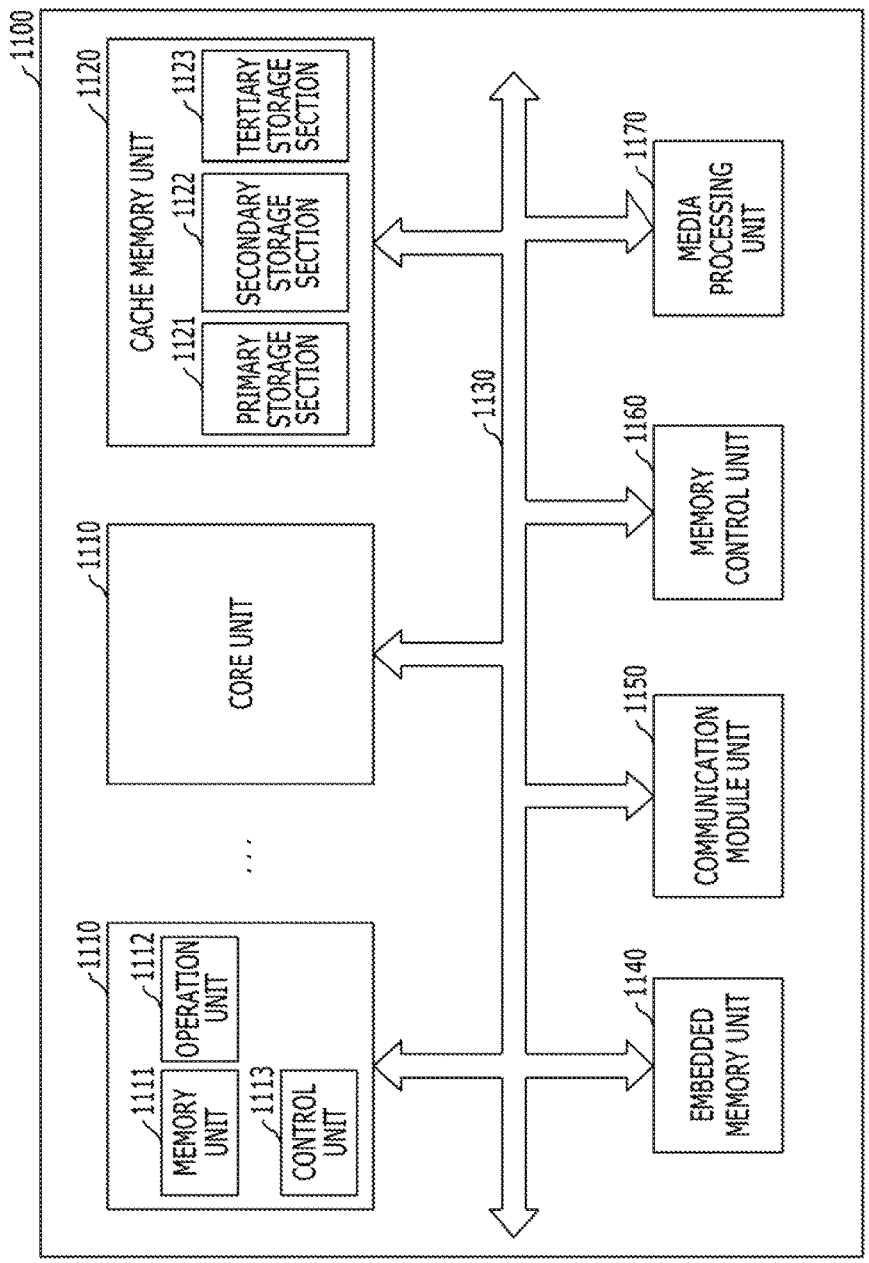
FIG. 9 is an example of configuration diagram of a processor implementing memory circuitry based on the disclosed technology.

FIG. 9 is an example of configuration diagram of a processor implementing memory circuitry based on the disclosed technology.

Referring to FIG. 9, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor a cache memory unit 120 which serves to storing data temporarily, and a bus interface 1130 for transferring data between internal and external devices. The processor 1100 may include various system-on-chips (SoCs) such as a multi-core processor a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100 as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include a first channel layer formed over a substrate and extending, in a vertical direction; a first stacked structure comprising a plurality of first interlayer dielectric layers and a plurality of first gate electrode layers which are alternately stacked along the first channel layer; a first memory layer interposed between the first channel layer and the first gate electrode layers; a second channel layer formed over the first channel layer and extending in the vertical direction; a second stacked structure comprising a plurality of second interlayer dielectric layers and a plurality of second gate electrode layers which are alternately stacked along the second channel layer; a second memory layer interposed between the second channel layer and the second gate electrode layers; a first channel connection pattern formed between the first channel layer and the second channel layer and coupling the first and the second channel layers to each other; and a first etch stop pattern formed between the first and second stacked structures and at substantially the same level as the first channel connection pattern, wherein the first etch stop pattern includes the same material as the first channel connection pattern and is isolated from the first channel connection pattern. Through this, memory cell characteristics and operating characteristics of the cache memory unit 1120 may be secured, and processes may be simplified. As a consequence, operating characteristics of the processor 1100 may be improved.

Although it was shown in FIG. 9 that all the primary, secondary and tertiary storage sections 1121, 1122 and 1123 are configured inside the cache memory unit 1120, it is to be noted that a the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data, processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 10 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110 and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device and a media processing unit 1170 which processes the data processed the processor 1100 or the data inputted from an external input device and outputs the processed data to an external interface device and so on. Besides, the processor 1100 may include a plurality of various modules and devices. In this case, the plurality of modules which are added, may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory) a mobile DRAM, an SRAM (static random access memory) and a memory with similar functions to above mentioned memories, and so on. The nonvolatile memory may include a ROM (read only memory) a NOR flash memory, a NAND flash memory, a phase change random access memory (PRAM), a resistive random access memory (RRAM), a spin transfer torque random access memory (STTRAM) a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (COMA), time division multiple access (TDMA), frequency division multiple access (FDMA), a wireless LAN, Zigbee, a ubiquitous sensor network (USN), Bluetooth, radio frequency identification (RFID), long term evolution (LTE) near field communication (NFC), a wireless broadband Internet (Wibro), high speed downlink packet access (HSDPA), wideband CDMA (WCDMA) ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of if Independent Disks), an SSD (solid state disk), eSATA (External SATA), PCMCIA (Personal Computer Memory Card International Association), a USE (universal serial bus), a secure digital (SD) card, a mini secure digital (mSD) card, a micro secure digital (micro SD) card, a secure digital high capacity (SDHC) card a memory stick card, a smart media (SM) card, a multimedia card (MMC) an embedded (eMMC), a compact flash (CF) card, and so on.

The media processing unit 1170 may process the data, processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio) a high definition muitimedia interlace (HDMI) controller, and so on.

Figure 10:
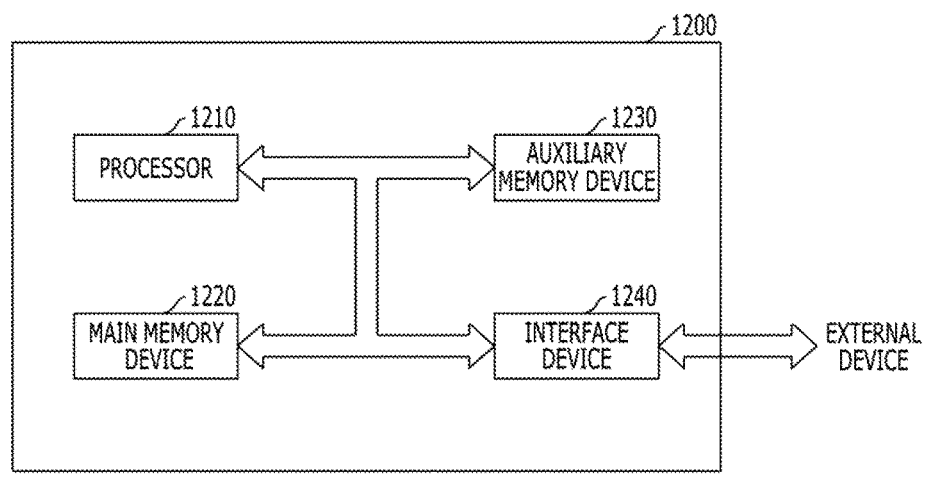
FIG. 10 is an example of configuration diagram of a system implementing memory circuitry based on the disclosed technology.

FIG. 10 is an example of configuration diagram of a system implementing memory circuitry based on the disclosed technology.

Referring to FIG. 10, a system 1200 as an apparatus for processing data may perform input processing, output, communication, storage, etc. to conduct a series of manipulations for data. The system 1200 may include a processor 1210, a main memory device 1220, an auxiliary memory device 1230, an interface device 1240 and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS) a video camera, a voice recorder, a telematics, an audio visual (AV) system, a smart television and so on.

The processor 1210 may decode inputted commands and processes operation comparison, etc. for the data stored in the system 1200 and controls these operations. The processor 1210 may include a microprocessor unit (MPU), a central processing unit (CPU), single/multi-core processor, a graphic processing unit (GPU), application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include a first channel layer formed over a substrate and extending in a vertical direction; a first stacked structure comprising a plurality of first interlayer dielectric layers and a plurality of first gate electrode layers which are alternately stacked along the first channel layer; a first memory layer interposed between the first channel layer and the first gate electrode layers; a second channel layer formed over the first channel layer and extending in the vertical direction; a second stacked structure comprising a plurality of second interlayer dielectric layers and a plurality of second gate electrode layers which are alternately stacked along the second channel layer; a second memory layer interposed between the second channel layer and the second gate electrode layers; a first channel connection pattern formed between the first channel layer and the second channel layer and coupling the first and the second channel layers to each other; and a first etch stop pattern formed between the first and second stacked structures and at substantially the same level as the first channel connection pattern, wherein the first etch stop pattern includes the same material as the first channel connection pattern and is isolated from the first channel connection pattern. Through this, memory cell characteristics and operating characteristics of the main memory device 1220 may be secured, and processes may be simplified. As a consequence, operating characteristics of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may n include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is memory device for storing program codes or data. While the speed of the auxiliary memory device 1230 is slower than the main memory device 1220 the auxiliary memory device 1230 can store a larger amount of data. The auxiliary memory device 1230 may include one or more of the above-described semiconductor devices in accordance with the implementations. For example, the auxiliary memory device 1230 may include a first channel layer formed over a substrate and extending in a vertical direction; a first stacked structure comprising a plurality of first interlayer dielectric layers and a plurality of first gate electrode layers which are alternately stacked along the first channel layer; a first memory layer interposed between the first channel layer and the first gate electrode layers; a second channel layer formed over the first channel layer and extending in the vertical direction; a second stacked structure comprising a plurality of second interlayer dielectric layers and a plurality of second gate electrode layers which are alternately stacked along the second channel layer; a second memory layer interposed between the second channel layer and the second gate electrode layers; a first channel connection pattern formed between the first channel layer and the second channel layer and coupling the first and the second channel layers to each other; and a first etch stop pattern formed between the first and second stacked structures and at substantially the same level as the first channel connection pattern, wherein the first etch, stop Pattern includes the same material as the first channel connection pattern and is isolated from the first channel connection pattern. Through this, memory cell characteristics and operating characteristics of the auxiliary memory device 1230 may be secured, and processes may be simplified. As a consequence, operating characteristics of the system 1200 may be improved.

Also, the auxiliary memory device 1230 may further include a data storage system (see the reference numeral 1300 of FIG. 10) such as a magnetic tape using magnetism a magnetic disk, a laser disk using optics, a magneto-optical disc using both magnetism and optics, a solid state disk (SSD), a USB memory (universal serial bus memory), a secure digital (SD) card, a mini secure digital (m D) card, a micro secure digital (micro SD) card, a secure digital high capacity (SDHC) card a memory stick card, a smart media (SM) card, a multimedia card (MMC), an embedded MMC (eMMC) a compact flash (CF) card, and so on. Unlike this, the auxiliary memory device 1230 may not include the semiconductor devices according to the implementations, but may include data storage systems (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card a mini secure digital (mSD) card, micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a key pad, a keyboard, a mouse, a speaker, a mike, a display, various human interface devices (HIDs), a communication device, and so on. The communication device may include a module capable of being connected with a wire d network, a module capable of being connected with a wireless network and both of them. The wired network module may include a local area network (LAN) a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA) ultra wideband (UWB) such as various devices which send and receive data without transmit lines and so on.

Figure 11:
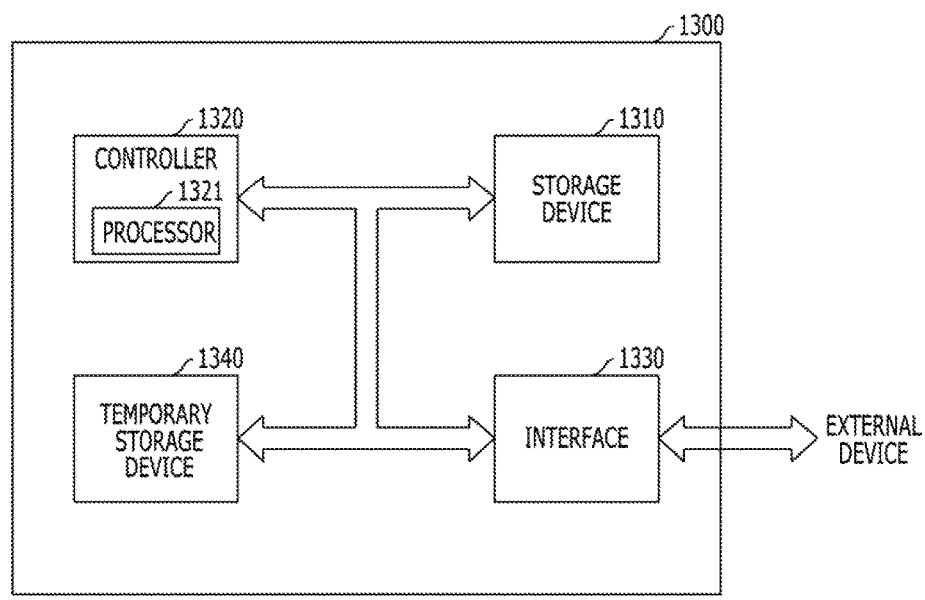
FIG. 11 is an example of configuration diagram of a data storage system implementing memory circuitry based on the disclosed technology.

FIG. 11 is an example of configuration diagram of a data storage system implementing memory circuitry based on the disclosed technology.

Referring to FIG. 11, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC) an embedded MMC (eMMC) a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from are outside of the data storage system 1300 and so or The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card a secure digital high capacity (SDHC) card, a memory stick card, a smart media (S M) card, a multimedia card (MMC), an embedded MMC (eMMC), a compact flash (CF) card and so on or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA: (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 may include a first channel layer formed over a substrate and extending in a vertical direction; a first stacked structure comprising a plurality of first interlayer dielectric layers and a plurality of first gate electrode layers which are alternately stacked along the first channel layer; a first memory layer interposed between the first channel layer and the first gate electrode layers; a second channel layer formed over the first channel layer and extending in the vertical direction; a second stacked structure comprising a plurality of second interlayer dielectric layers and a plurality of second gate electrode layers which are alternately stacked along the second channel layer; a second memory layer interposed between the second channel layer and the second gate, electrode layers; a first channel connection pattern formed between the first channel layer and the second channel layer and coupling the first and the second channel layers to each other; and a first etch stop pattern formed between the first and second stacked structures and at substantially the same level as the first channel connection pattern, wherein the first etch stop pattern includes the same material as the first channel connection pattern and is isolated from the first channel connection pattern. Through this, memory cell characteristics and operating characteristics of the storage device 1310 or the temporary storage device 1340 may be secured, and processes may be simplified. As a consequence, operating characteristics and data storage characteristics of the data storage system 1300 may be improved.

Figure 12:
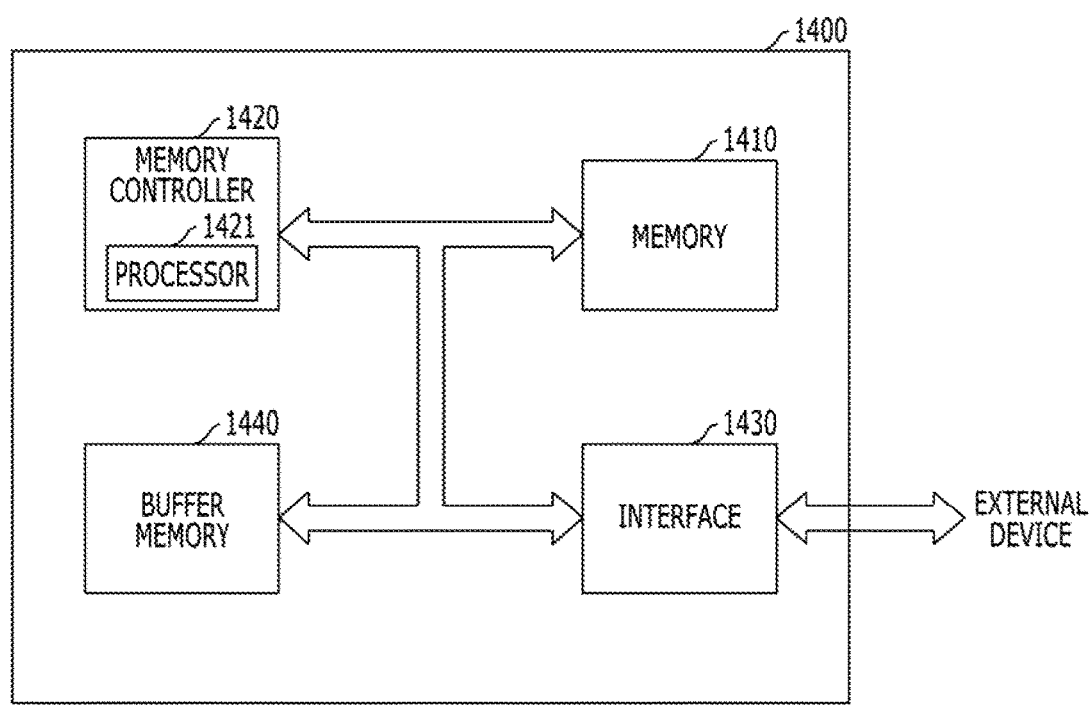
FIG. 12 is an example of configuration diagram of a memory system implementing memory circuitry based on the disclosed technology.

FIG. 12 is an example of configuration diagram of a memory system implementing memory circuitry based on the disclosed technology.

Referring to FIG. 12, a memory system 1400 may in de a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include a first channel layer formed over a substrate and extending in a vertical direction; a first stacked structure comprising a plurality of first interlayer dielectric layers and a plurality of first gate electrode layers which are alternately stacked a long the first channel layer; a first memory layer interposed between the first channel layer and the first gate electrode layers; a second channel layer formed over the first channel layer and extending in the vertical direction; a second stacked structure comprising a plurality of second interlayer dielectric layers and a plurality of second gate electrode layers which are alternately stacked along the second channel layer; a second memory layer interposed between the second channel layer and the second gate electrode layers; a first channel connection pattern formed between the first channel layer and the second channel layer and coupling the first and the second channel layers to each other; and a first etch stop pattern formed between the first and second stacked structures and at substantially the same level as the first channel connection pattern, wherein the first etch, stop pattern includes the same material as the first channel connection pattern and is isolated from the first channel connection pattern. Through this, memory cell characteristics and operating characteristics of the memory 1410 may be secured, and processes may be simplified. As a consequence, operating characteristics and data storage characteristics of the memory system 1400 may be improved.

Also, the memory 1410 according t the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include a first channel layer formed over a substrate and extending in vertical direction; a first stacked structure comprising a plurality of first interlayer dielectric layers and a plurality of first gate electrode layers which are alternately stacked along the first channel layer; a first memory layer interposed between the first channel layer and the first gate electrode layers; a second channel layer formed over the first channel layer and extending in the vertical direction; a second stacked structure comprising a plurality of second interlayer dielectric layers and a plurality of second gate electrode layers which are alternately stacked along the second channel layer; a second memory layer interposed between the second channel layer and the second gate electrode layers; a first channel connection pattern formed between the first channel layer and the second channel layer and coupling the first and the second channel layers to each other; and a first etch stop pattern formed between the first and second stacked structures and at substantially the same level as the first channel connection pattern, wherein the first etch stop pattern includes the same material as the first channel connection pattern and is isolated from the first channel connection pattern. Through this, memory cell characteristics and operating characteristics of the buffer memory 1440 may be secured, and processes may be simplified. As a consequence, operating characteristics and data storage characteristics of the memory system 1400 may be improved.

Moreover, the buffer memory 1440 according to the present implementation may further include an SRAM (static random access memory) a DRAM (dynamic random access memory) and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Although various embodiments have been described for illustrative purposes, it will be apparent to those skilled in the art that various changes and modifications may be made without departing from the spirit and scope of the invention as defined in the following claims.

What is claimed is:

1. An electronic device comprising a semiconductor memory, the semiconductor memory comprising:
    a first channel layer formed over a substrate and extending in a vertical direction;
    a first stacked structure comprising a plurality of first interlayer dielectric layers and a plurality of first gate electrode layers which are alternately stacked along the first channel layer;
    a first memory layer interposed between the first channel layer and the first gate electrode layers;
    a second channel layer formed over the first channel layer and extending in the vertical direction;
    a second stacked structure comprising a plurality of second interlayer dielectric layers and a plurality of second gate electrode layers which are alternately stacked along the second channel layer;
    a second memory layer interposed between the second channel layer and the second gate electrode layers;
    a first channel connection pattern formed between the first channel layer and the second channel layer and coupling the first and the second channel layers to each other; and
    a first stop pattern formed between the first and second stacked structures and at the same level as the first channel connection pattern.

2. The electronic device of claim 1, wherein the semiconductor memory further comprises:
    an insulating material provided between the first channel connection pattern and the first stop pattern.

3. The electronic device of claim 1, wherein the first channel connection pattern has a width greater than a top surface of the first channel layer and a bottom surface of the second channel layer.

4. The electronic device of claim 1, wherein the semiconductor memory further comprises:
    a first slit passing through the first stacked structure, the first stop pattern, and the second stacked structure.

5. The electronic device of claim 4, wherein the first stop pattern has a width greater than the first slit.

6. The electronic device of claim 1, wherein the semiconductor memory further comprises:
    a third channel layer passing through the first stacked structure, wherein the first and the third channel layers are arranged in parallel to each other and at the same level;
    a fourth channel layer passing through the second stacked structure, wherein the second and the fourth channel layers are arranged in parallel to each other and at the same level; and
    a second channel connection pattern formed between the third channel layer and the fourth channel layer and coupling the third and fourth channel layers to each other, and
    wherein each of the first and the second channel connection patterns has an island shape.

7. The electronic device of claim 1, wherein the semiconductor memory further comprises:
    a second stop pattern formed between the first and second stacked structures and at the same level as the first stop pattern, and
    a second slit passing through the first stacked structure, the second stop pattern, and the second stacked structure.

8. The electronic device of claim 7, wherein the second stop pattern has a width greater than the second slit.

9. The electronic device of claim 1, wherein each of the first channel connection pattern and the first stop pattern comprises a conductive material.

10. The electronic device of claim 1, wherein the semiconductor memory further comprises:
    a first epitaxial layer,
    wherein the first channel layer has a tube shape with a hollow center,
    wherein the first memory layer surrounds an outer sidewall and a bottom surface of the first channel layer, and
    wherein the first epitaxial layer extends from the substrate to the hollow center of the first channel layer to connect the substrate and the first channel layer to each other.

11. The electronic device of claim 1,
    wherein the semiconductor memory further comprises a second epitaxial layer,
    wherein the second channel layer has a tube shape with a hollow center,
    wherein the second memory layer surrounds an outer sidewall and a bottom surface of the second channel layer, and
    wherein the second epitaxial layer extends from the substrate to the hollow center of the second channel layer to connect the substrate and the second channel layer to each other.

12. The electronic device of claim 1, wherein the first channel layer is in direct contact with the substrate.

13. The electronic device of claim 1, wherein the second channel layer is in direct contact with the first channel connection pattern.

14. The electronic device of claim 1, wherein the first memory layer further extends between the first interlayer dielectric layer and the first gate electrode layer.

15. The electronic device of claim 1, wherein the second memory layer further extends between the second interlayer dielectric layer and the second gate electrode layer.

16. The electronic device of claim 1,
    wherein the semiconductor memory further comprises a third channel layer and a connection member,
    wherein the third channel layer passes through the first stacked structure and is arranged in parallel to the first channel layer at the same level, and wherein the connection member is formed in the substrate and coupled to bottoms of the first and the third channel layers.

17. The electronic device of claim 16,
    wherein the semiconductor memory further comprises an additional gate electrode layer and an insulating layer,
    wherein the additional gate electrode layer is formed in the substrate,
    wherein the connection member is formed of the same material as the first channel layer and formed in the additional gate electrode layer; and
    wherein the insulating layer is positioned between the additional gate electrode and the substrate.

18. The electronic device of claim 16, wherein the connection member includes a conductive material.

19. The electronic device of claim 1, wherein the first stop pattern is isolated from the first channel connection pattern.

20. The electronic device of claim 1, wherein the first stop pattern includes the same material as the first channel connection pattern.

21. An electronic device comprising a semiconductor memory, the semiconductor memory comprising:
- a first stack comprising first interlayer dielectric layers and first gate electrode layers which are alternately stacked;
- a first channel layer passing through the first stack;
- a second stack comprising second interlayer dielectric layers and second gate electrode layers which are alternately stacked;
- a second channel layer passing through the second stack;
- a channel connection pattern formed between the first channel layer and the second channel layer and coupling the first and the second channel layers to each other;
- a stop pattern formed between the first and second stacked structures and at Substantially the same level as the channel connection pattern, wherein the stop pattern is isolated from the channel connection pattern; and
- an insulating material provided between the channel connection pattern and the stop pattern.

22. The electronic device of claim 21, wherein the stop layer is a planarization stop pattern.

23. The electronic device of claim 21, wherein a lower surface of the stop pattern contacts an uppermost first interlayer dielectric layer and an upper surface of the stop pattern contacts a lowermost second interlayer dielectric layer.

24. The electronic device of claim 21, wherein the stop pattern has the same thickness as the channel connection pattern.

25. The electronic device of claim 21, wherein the first gate electrode layers include polysilicon and the second gate electrode layers include polysilicon.

26. The electronic device of claim 21, further comprising:
- a first memory layer interposed between the first channel layer and the first gate electrode layers, wherein the first memory layer is a polysilicon layer; and
- a second memory layer interposed between the second channel layer and the second gate electrode layers, wherein the second memory layer is a polysilicon layer.

27. The electronic device of claim 21, wherein the channel connection pattern includes polysilicon.

* * * * *